(12) United States Patent
Kang et al.

(10) Patent No.: US 11,037,991 B2
(45) Date of Patent: Jun. 15, 2021

(54) VARIABLE RESISTANCE MEMORY DEVICE

(71) Applicant: SAMSUNG ELECTRONICS CO., LTD., Suwon-si (KR)

(72) Inventors: Yoongoo Kang, Hwaseong-si (KR); Changwoo Seo, Suwon-si (KR); Dain Lee, Hwaseong-si (KR); Wook-Yeol Yi, Hwaseong-si (KR); Hoi Sung Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/392,099

(22) Filed: Apr. 23, 2019

(65) Prior Publication Data

US 2020/0105832 A1    Apr. 2, 2020

(30) Foreign Application Priority Data

Oct. 2, 2018    (KR) ......................... 10-2018-0117632

(51) Int. Cl.
*H01L 45/02* (2006.01)
*H01L 27/24* (2006.01)
*H01L 45/00* (2006.01)

(52) U.S. Cl.
CPC ............ *H01L 27/249* (2013.01); *H01L 45/06* (2013.01); *H01L 45/126* (2013.01); *H01L 45/1233* (2013.01); *H01L 45/143* (2013.01); *H01L 45/144* (2013.01); *H01L 45/1683* (2013.01)

(58) Field of Classification Search
None
See application file for complete search history.

(56) References Cited

U.S. PATENT DOCUMENTS

| 8,148,764 | B2 | 4/2012 | Park et al. | |
|---|---|---|---|---|
| 10,128,155 | B2 | 11/2018 | Jeong et al. | |
| 2010/0255218 | A1 | 10/2010 | Oka et al. | |
| 2011/0256726 | A1 | 10/2011 | LaVoie et al. | |
| 2012/0009755 | A1* | 1/2012 | Park | H01L 27/2409 438/382 |
| 2013/0134371 | A1* | 5/2013 | Park | H01L 45/1675 257/1 |
| 2015/0361553 | A1 | 12/2015 | Murakawa | |
| 2016/0056376 | A1* | 2/2016 | Horii | H01L 45/1253 257/4 |
| 2017/0117328 | A1* | 4/2017 | Terai | H01L 45/06 |
| 2017/0243919 | A1* | 8/2017 | Seong | H01L 45/1233 |

(Continued)

FOREIGN PATENT DOCUMENTS

| KR | 10-1095780 B1 | 12/2011 |
|---|---|---|
| KR | 10-2015-0037662 A | 4/2015 |

(Continued)

*Primary Examiner* — Benjamin P Sandvik
(74) *Attorney, Agent, or Firm* — Sughrue Mion, PLLC

(57) ABSTRACT

A variable resistance memory device includes memory cells arranged on a substrate and an insulating structure between the memory cells. Each of the memory cells includes a variable resistance pattern and a switching pattern vertically stacked on the substrate. The insulating structure includes a first insulating pattern between the memory cells, and a second insulating pattern between the first insulating pattern and each of the memory cells. The first insulating pattern includes a material different from a material of the second insulating pattern.

17 Claims, 33 Drawing Sheets

(56) References Cited

U.S. PATENT DOCUMENTS

| | | | |
|---|---|---|---|
| 2017/0243922 A1* | 8/2017 | Eun | H01L 45/144 |
| 2018/0090319 A1 | 3/2018 | Miyahara et al. | |
| 2018/0166443 A1 | 6/2018 | Kim et al. | |
| 2018/0230591 A1 | 8/2018 | Jang et al. | |
| 2019/0006422 A1* | 1/2019 | Park | G11C 13/0004 |
| 2020/0091234 A1* | 3/2020 | Lee | H01L 45/126 |

FOREIGN PATENT DOCUMENTS

| | | |
|---|---|---|
| KR | 10-1680379 B1 | 11/2016 |
| KR | 10-2017-0019668 A | 2/2017 |
| KR | 10-2017-0120900 A | 11/2017 |
| KR | 10-2017-0142698 A | 12/2017 |
| KR | 10-1803768 B1 | 12/2017 |

* cited by examiner

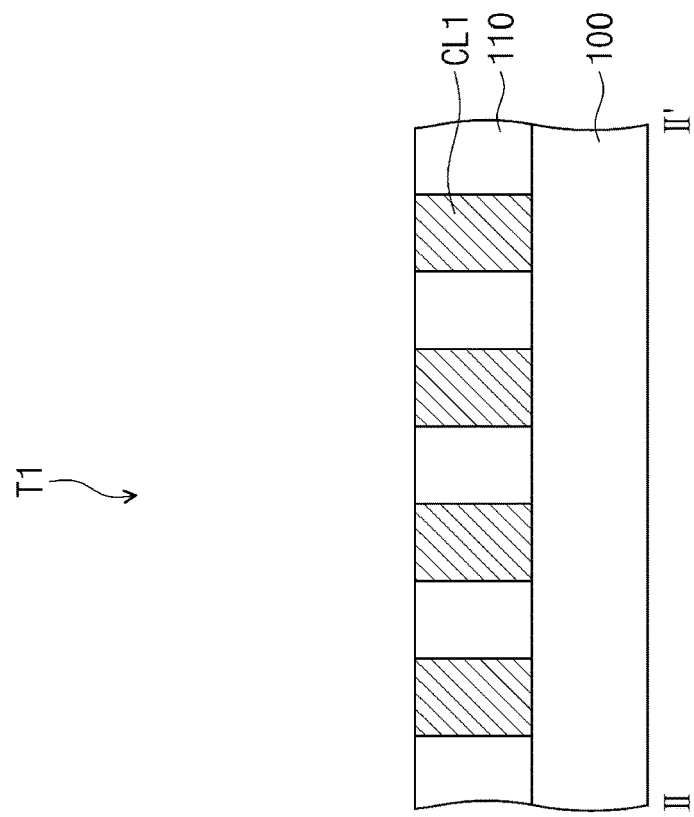
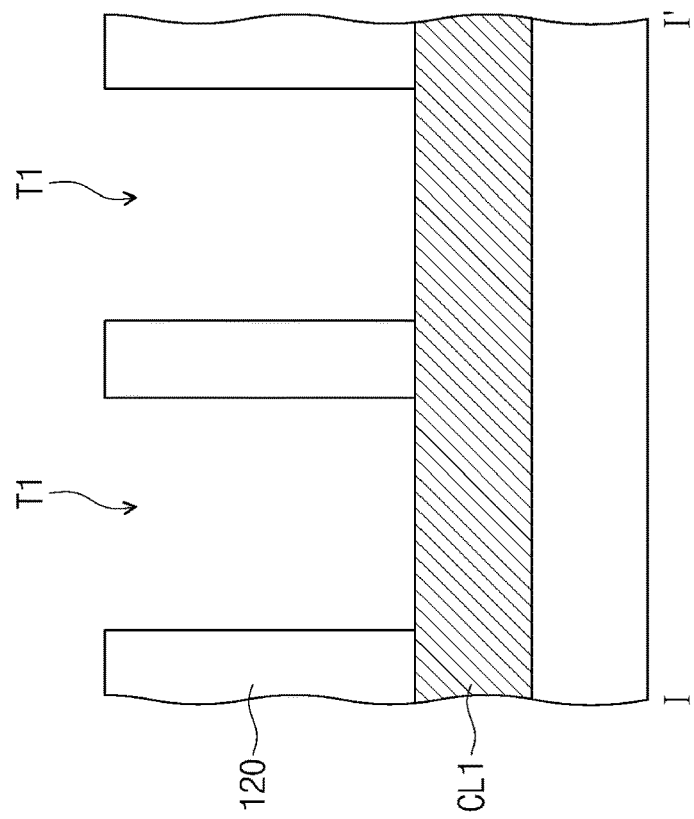
FIG. 6A
FIG. 6B

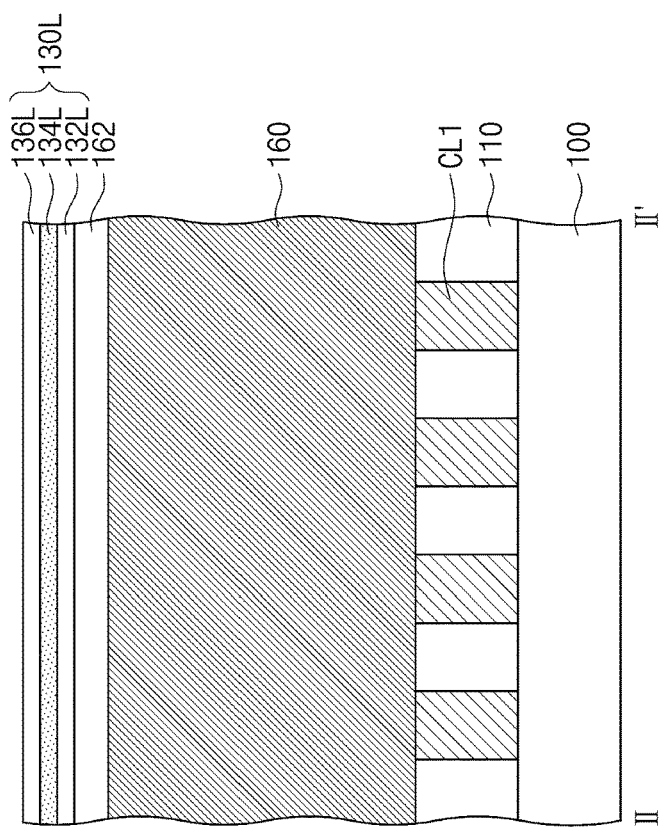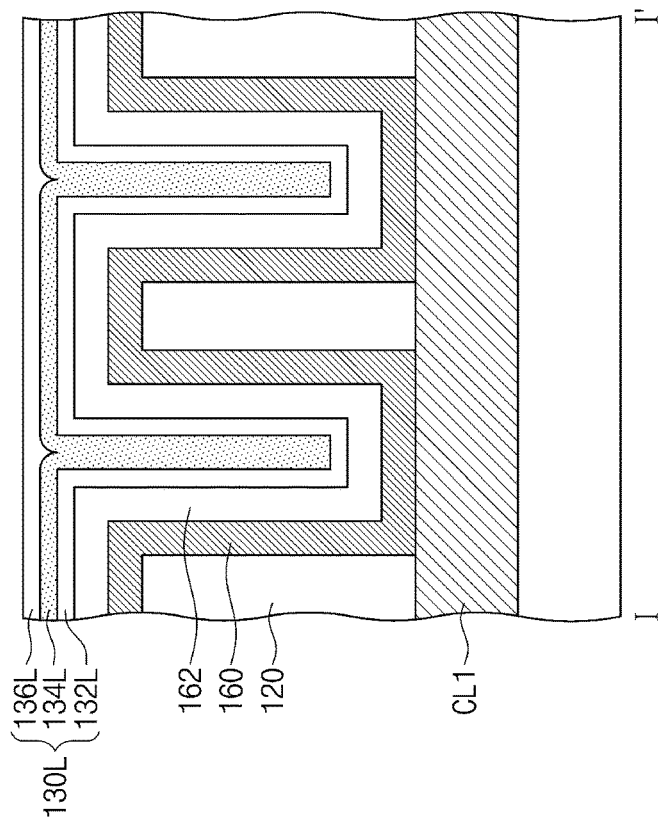
FIG. 7B
FIG. 7A

FIG. 19A
FIG. 19B
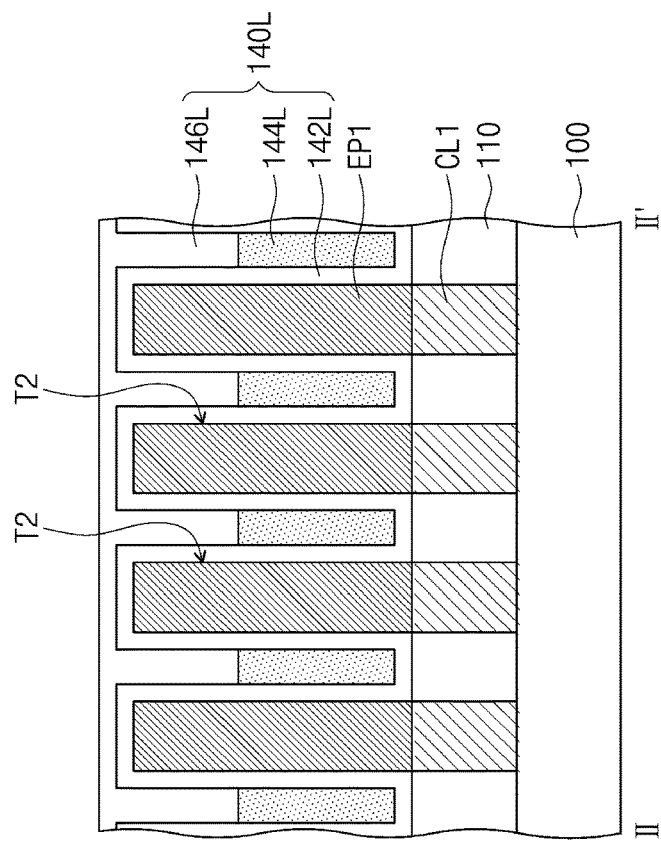
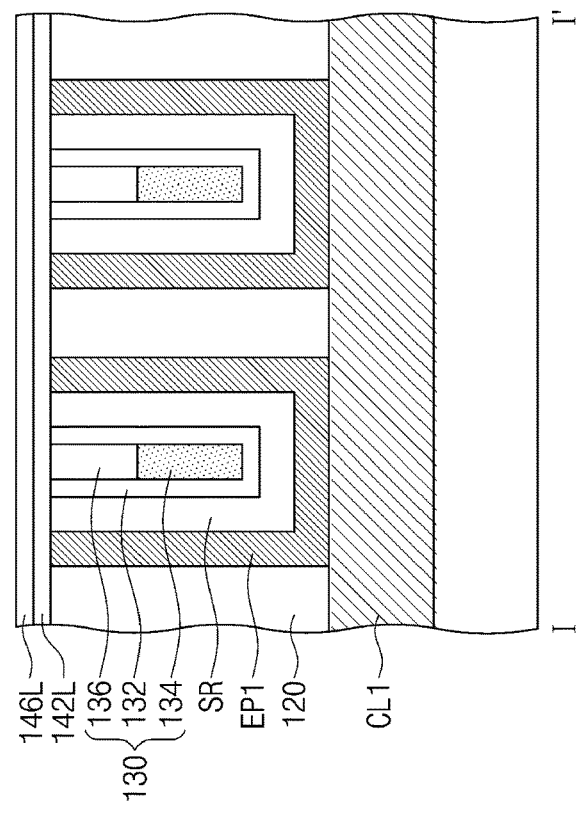

VARIABLE RESISTANCE MEMORY DEVICE

CROSS-REFERENCE TO THE RELATED APPLICATION

This application claims priority from Korean Patent Application No. 10-2018-0117632, filed on Oct. 2, 2018, in the Korean Intellectual Property Office, the disclosure of which is hereby incorporated by reference in its entirety.

BACKGROUND

Embodiments relate to a semiconductor device and, more particularly, to a variable resistance memory device and a method of manufacturing the same.

Semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

Next-generation semiconductor memory devices (e.g., magnetic random access memory (MRAM) devices and phase-change random access memory (PRAM) devices) have been developed to provide high-performance and low power consuming semiconductor memory devices. Materials of these next-generation semiconductor memory devices may have resistance values variable according to currents or voltages applied thereto and may retain their resistance values even when currents or voltages are interrupted.

SUMMARY

Various embodiments may provide a variable resistance memory device with improved electrical characteristics and a method of manufacturing the same.

The embodiments may also provide a variable resistance memory device capable of reducing or minimizing defects and a method of manufacturing the same.

In an aspect of the embodiments, a variable resistance memory device may include memory cells horizontally arranged on a substrate, and an insulating structure between the memory cells. Each of the memory cells may include a variable resistance pattern and a switching pattern vertically stacked on the substrate. The insulating structure may include a first insulating pattern between the memory cells, and a second insulating pattern between the first insulating pattern and each of the memory cells. The first insulating pattern may include a material different from a material of the second insulating pattern.

BRIEF DESCRIPTION OF THE DRAWINGS

The inventive concepts will become more apparent in view of the attached drawings and accompanying detailed description.

FIGS. 6A-6B to 13A-13B are cross-sectional views corresponding to the lines I-I' and II-II' of FIG. 3, respectively, to illustrate a method of manufacturing a variable resistance memory device according to some embodiments.

DETAILED DESCRIPTION OF THE EMBODIMENTS

Hereinafter, embodiments will be described in detail with reference to the accompanying drawings. The embodiments described herebelow are all exemplary, and thus, the inventive concepts are not limited to these embodiments disclosed below and may be realized in various other forms.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
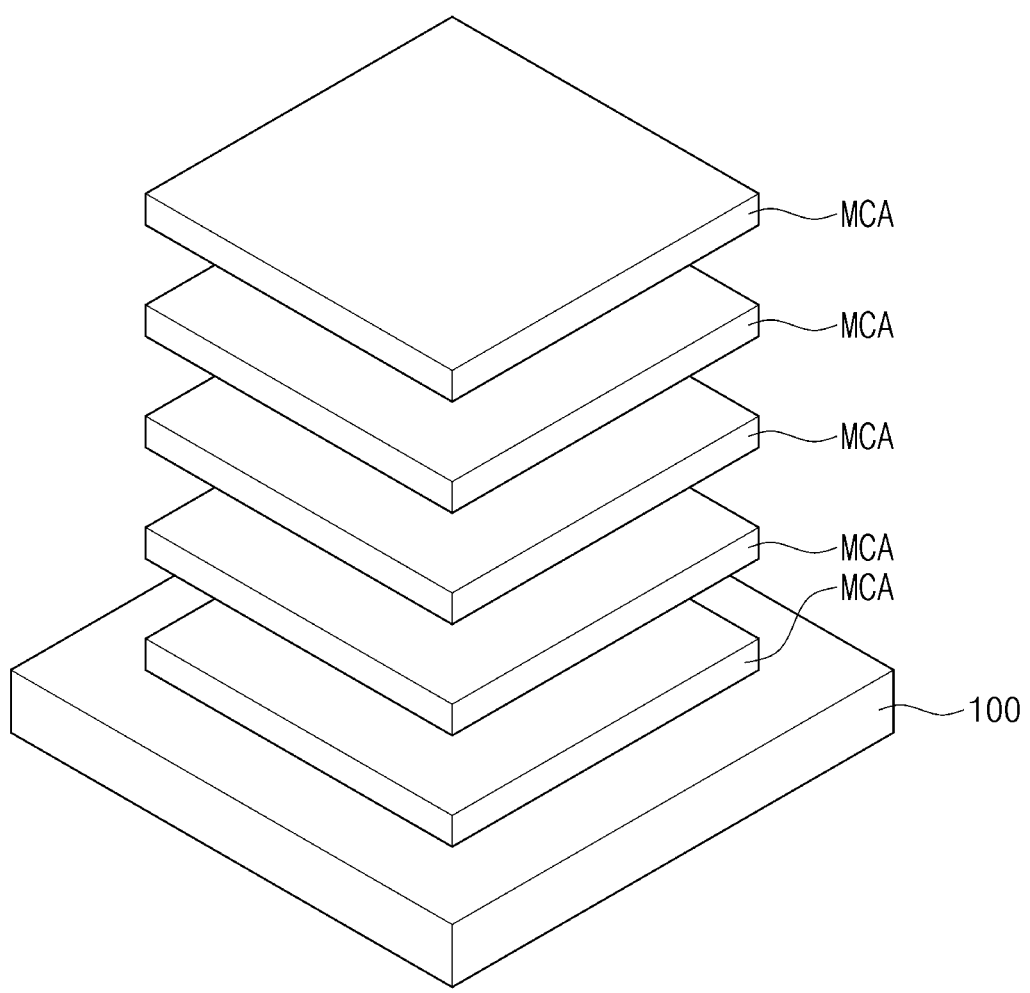
FIG. 1 is a conceptual view illustrating a variable resistance memory device according to some embodiments.

FIG. 1 is a conceptual view illustrating a variable resistance memory device according to some embodiments.

Referring to FIG. 1, a variable resistance memory device may include a plurality of memory cell stacks MCA sequentially stacked on a substrate 100. Each of the memory cell stacks MCA may include a plurality of memory cells two-dimensionally arranged. The variable resistance memory device may also include conductive lines which are disposed between the memory cell stacks MCA and are used for write, read and/or erase operation of the memory cells. FIG. 1 illustrates five memory cell stacks MCA. However, embodiments are not limited thereto.

Figure 2:
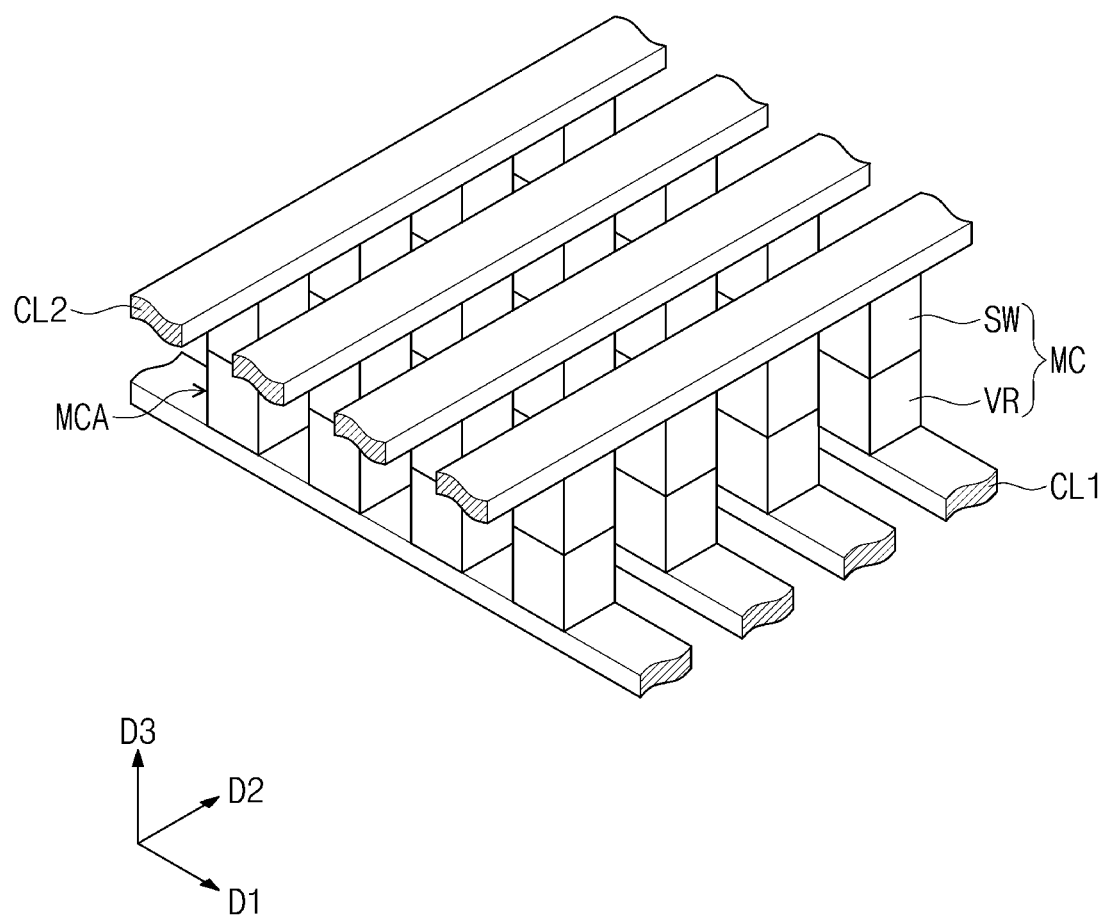
FIG. 2 is a perspective view schematically illustrating a variable resistance memory device according to some embodiments.

FIG. 2 is a perspective view schematically illustrating a variable resistance memory device according to some embodiments. FIG. 2 illustrates one memory cell stack MCA as an example. However, embodiments of the inventive concepts are not limited thereto.

Referring to FIG. 2, first conductive lines CL1 and second conductive lines CL2 may be provided. The first conductive lines CL1 may extend in a first direction D1, and the second conductive lines CL2 may extend in a second direction D2 intersecting the first direction D1. The second conductive lines CL2 may be spaced apart from the first conductive lines CL1 in a third direction D3 perpendicular to the first and second directions D1 and D2. The memory cell stack MCA may be provided between the first conductive lines CL1 and the second conductive lines CL2. The memory cell stack MCA may include memory cells MC that are provided at intersecting points of the first conductive lines CL1 and the second conductive lines CL2, respectively. The memory cells MC may be two-dimensionally arranged to constitute rows and columns.

Each of the memory cells MC may include a variable resistance pattern VR and a switching pattern SW. The variable resistance pattern VR and the switching pattern SW may be connected in series between a pair of the conductive lines CL1 and CL2 connected thereto. For example, the variable resistance pattern VR and the switching pattern SW included in each of the memory cells MC may be connected in series between a corresponding one of the first conductive lines CL1 and a corresponding one of the second conductive lines CL2. In FIG. 2, the switching pattern SW is provided on the variable resistance pattern VR. However, embodiments of the inventive concepts are not limited thereto. In certain embodiments, the variable resistance pattern VR may be provided on the switching pattern SW, unlike FIG. 2.

Figure 3:
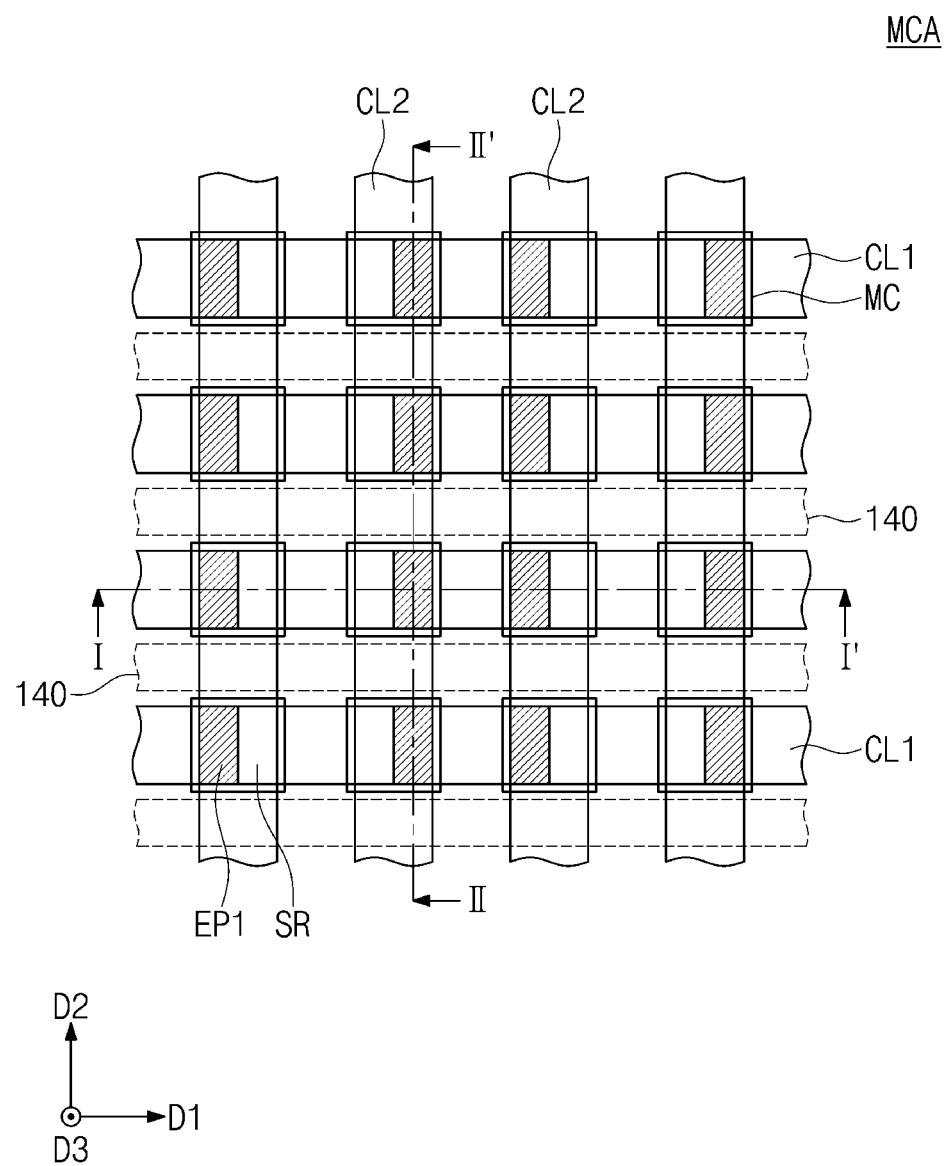
FIG. 3 is a plan view illustrating a variable resistance memory device according to some embodiments.
Figure 4A:
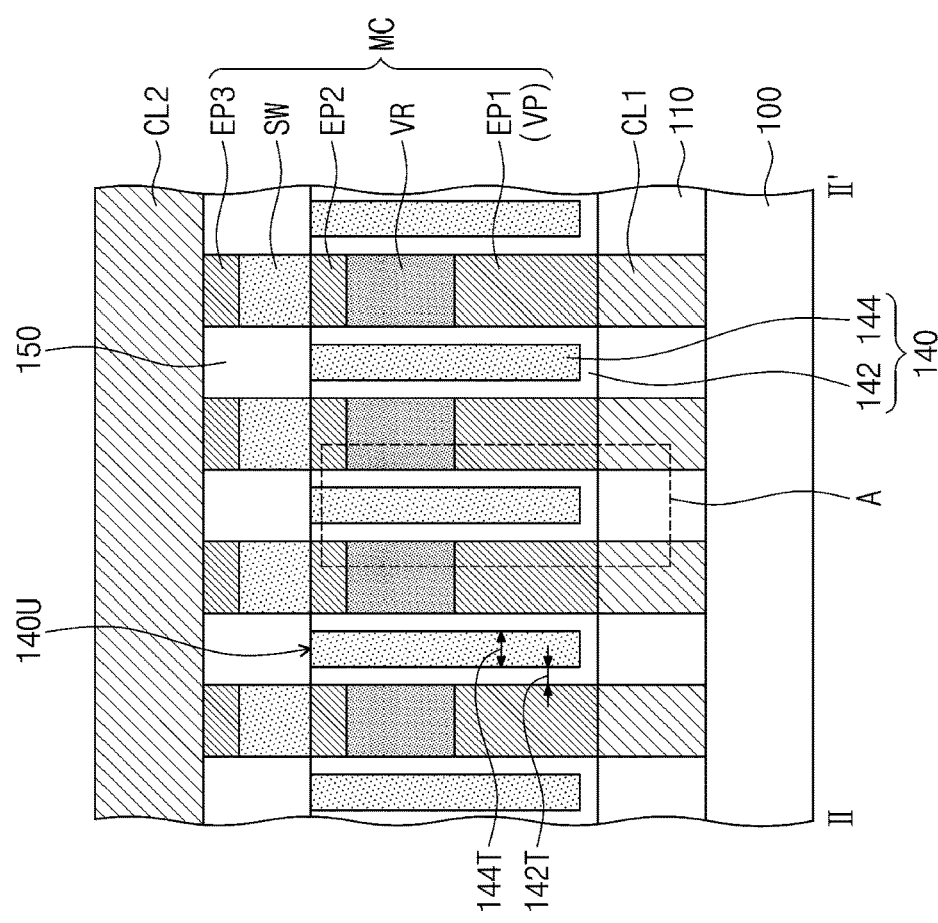
FIGS. 4A-4B are cross-sectional views taken along lines I-I' and II-II' of FIG. 3, respectively.
Figure 4B:
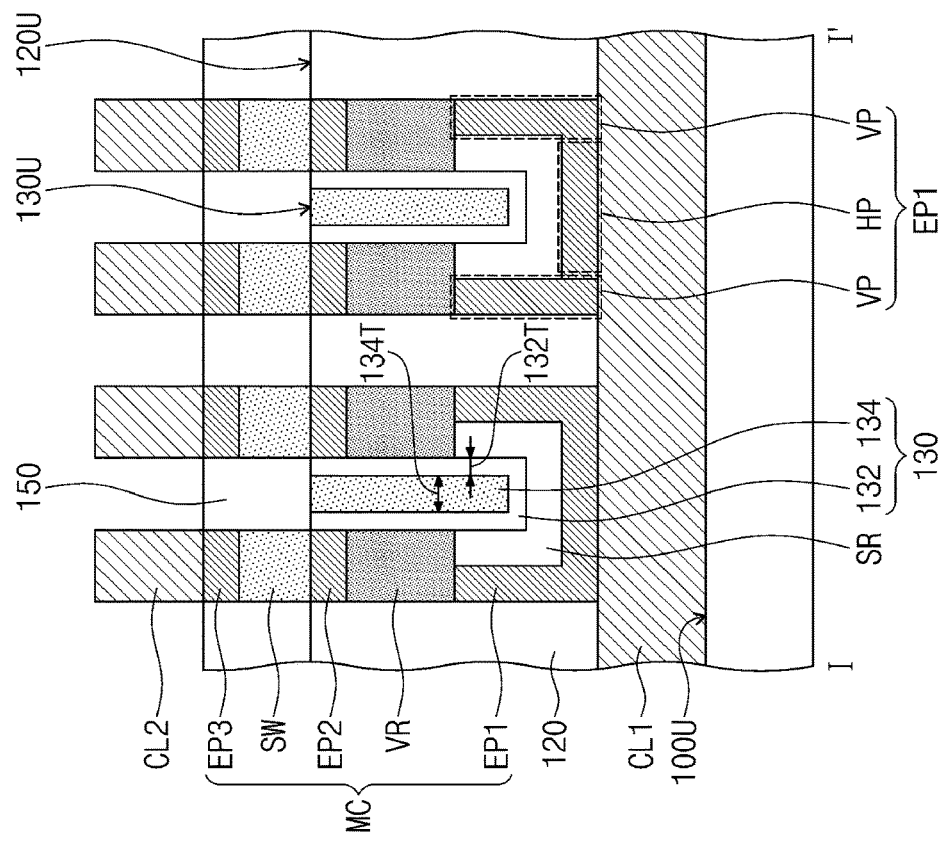
Figure 5:
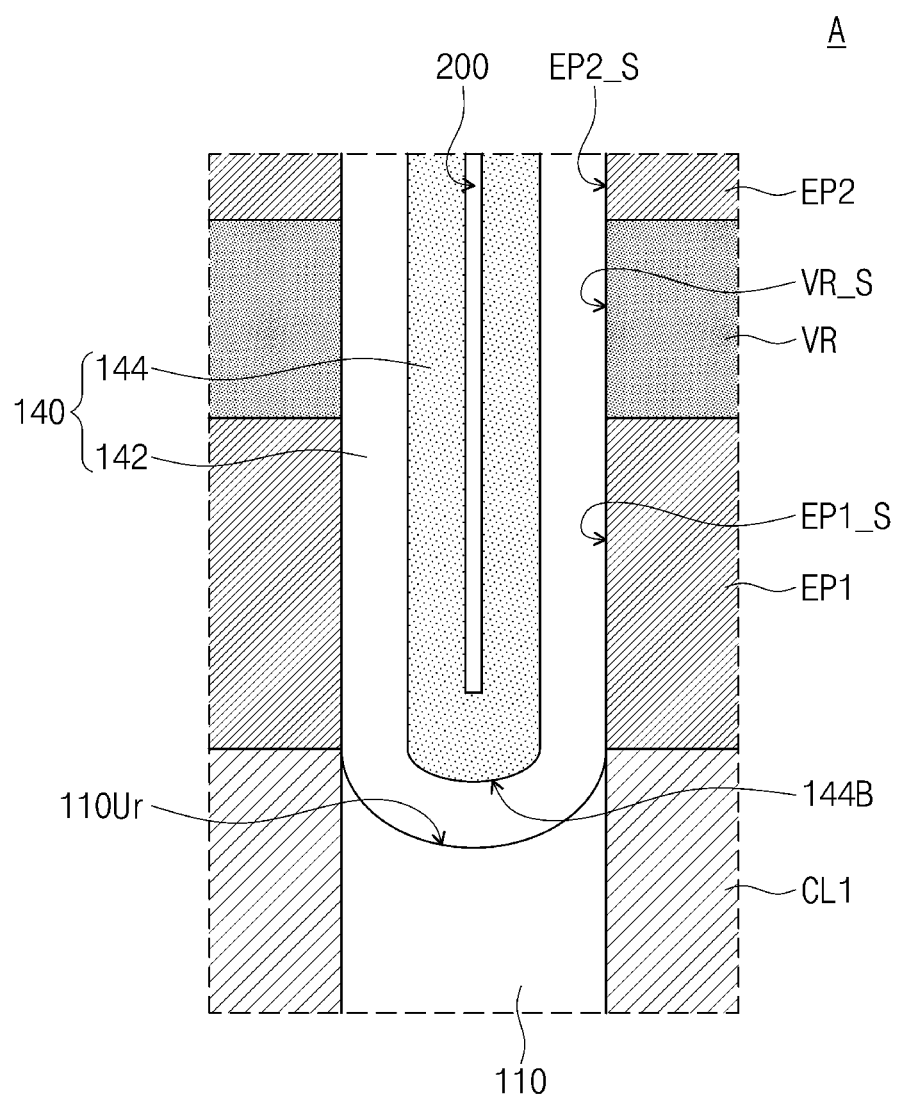
FIG. 5 is an enlarged view of a portion 'A' of FIG. 4B.

FIG. 3 is a plan view illustrating a variable resistance memory device according to some embodiments. FIGS. 4A-4B are cross-sectional views taken along lines I-I' and II-II' of FIG. 3, respectively, and FIG. 5 is an enlarged view of a portion 'A' of FIG. 4B. A variable resistance memory device according to some embodiments will be described based on one memory cell stack MCA for the purpose of ease and convenience in explanation.

Referring to FIGS. 3 and 4A-4B, first conductive lines CL1 and a lower interlayer insulating layer 110 covering the first conductive lines CL1 may be disposed on a substrate 100. The first conductive lines CL1 may extend in the first direction D1, and may be spaced apart from one another in the second direction D2. The first direction D1 and the second direction D2 may be parallel to a top surface 100U of the substrate 100, and may intersect each other. The first conductive lines CL1 may be disposed in the lower interlayer insulating layer 110, and the lower interlayer insulating layer 110 may expose top surfaces of the first conductive lines CL1. The top surfaces of the first conductive lines CL1 may be substantially coplanar with a top surface of the lower interlayer insulating layer 110. The first conductive lines CL1 may include a metal (e.g., copper, tungsten, or aluminum) and/or a metal nitride (e.g., tantalum nitride, titanium nitride, or tungsten nitride). For example, the lower interlayer insulating layer 110 may include at least one of silicon oxide, silicon nitride, and silicon oxynitride.

Second conductive lines CL2 may be provided on the substrate 100 to intersect the first conductive lines CL1. The second conductive lines CL2 may extend in the second direction D2, and may be spaced apart from one another in the first direction D1. The second conductive lines CL2 may be spaced apart from the first conductive lines CL1 in the third direction D3. The third direction D3 may be perpendicular to the top surface 100U of the substrate 100. The second conductive lines CL2 may include a metal (e.g., copper, tungsten, or aluminum) and/or a metal nitride (e.g., tantalum nitride, titanium nitride, or tungsten nitride).

Memory cells MC may be disposed between the first conductive lines CL1 and the second conductive lines CL2, and may be located at intersecting points of the first conductive lines CL1 and the second conductive lines CL2, respectively. The memory cells MC may be two-dimensionally arranged in the first direction D1 and the second direction D2. The memory cells MC may constitute one memory cell stack MCA. Each of the memory cells MC may be provided between a corresponding one of the first conductive lines CL1 and a corresponding one of the second conductive lines CL2. Each of the memory cells MC may include a variable resistance pattern VR and a switching pattern SW, which are connected in series between the corresponding first conductive line CL1 and the corresponding second conductive line CL2. In some embodiments, the variable resistance pattern VR may have an island shape locally provided at the intersecting point of the corresponding first conductive line CL1 and the corresponding second conductive line CL2, and the switching pattern SW may have an island shape locally provided at the intersecting point of the corresponding first conductive line CL1 and the corresponding second conductive line CL2. The variable resistance pattern VR may be disposed between the substrate 100 and the switching pattern SW. However, embodiments are not limited thereto. Unlike FIG. 4, the switching pattern SW may be disposed between the substrate 100 and the variable resistance pattern VR.

The variable resistance pattern VR may include a material capable of storing information (or data) using its resistance change. For example, the variable resistance pattern VR may include a material of which a phase is reversibly changeable between a crystalline state and an amorphous state by a temperature. For example, the variable resistance pattern VR may include a compound that includes at least one of Te and Se (i.e., chalcogen elements) and at least one of Ge, Sb, Bi, Pb, Sn, Ag, As, S, Si, In, Ti, Ga, P, O, and C. For example, the variable resistance pattern VR may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. For another example, the variable resistance pattern VR may have a superlattice structure in which layers including Ge and layers not including Ge are alternately and repeatedly stacked (e.g., a structure in which GeTe layers and SbTe layers are alternately and repeatedly stacked).

The switching pattern SW may be an element based on a threshold switching phenomenon having a nonlinear I-V curve (e.g., a S-shaped I-V curve). For example, the switching pattern SW may be an ovonic threshold switch (OTS) element having a bi-directional characteristic. The switching pattern SW may have a phase transition temperature for phase transition between the crystalline state and the amorphous state, which is higher than that of the variable resistance pattern VR. Thus, when the variable resistance memory device according to the embodiments is operated, a phase of the variable resistance pattern VR may be reversibly changeable between the crystalline state and the amorphous state, but the switching pattern SW may be maintained in a substantially amorphous state without a phase change. In the present specification, the term 'substantially amorphous state' may include an amorphous state, and may also include a case in which a grain boundary or a crystallized portion locally exists in a portion of a component.

The switching pattern SW may include a chalcogenide material. The chalcogenide material may include a compound which includes a chalcogen element (e.g., Te and/or Se) and at least one of Ge, Sb, Bi, Al, Pb, Sn, Ag, As, S, Si, In, Ti, Ga, and P. For example, the chalcogenide material may include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe. In some embodiments, the switching pattern SW may further include an impurity, for example, at least one of C, N, B, and O.

Each of the memory cells MC may further include a lower electrode EP1 disposed between the variable resistance pattern VR and the corresponding first conductive line CL1. The variable resistance pattern VR may be electrically connected to the corresponding first conductive line CL1 through the lower electrode EP1. Referring to FIG. 4A, a pair of the memory cells MC adjacent to each other in the first direction D1 may share the lower electrode EP1. For example, the variable resistance patterns VR of the pair of memory cells MC may be connected in common to the corresponding first conductive line CL1 through one lower electrode EP1. The lower electrode EP1 may include vertical portions VP connected to the variable resistance patterns VR of the pair of memory cells MC, respectively, and a horizontal portion HP horizontally extending on the corresponding first conductive line CL1 between the pair of memory cells MC. The horizontal portion HP may extend along a top surface of the corresponding first conductive line CL1 between the pair of memory cells MC and may connect the vertical portions VP to each other. The lower electrode EP1 may have a U-shape when viewed in a cross-sectional view. The lower electrode EP1 may be a heater electrode which heats the variable resistance pattern VR to change a phase of the variable resistance pattern VR. The lower electrode EP1 may include a material of which a specific resistance is greater than those of the first and second conductive lines CL1 and CL2. For example, the lower electrode EP1 may include at least one of W, Ti, Al, Cu, C, CN, TiN, TiAlN, TiSiN, TiCN, WN, CoSiN, WSiN, TaN, TaCN, TaSiN, and TiO.

Each of the memory cells MC may include a connection electrode EP2 between the variable resistance pattern VR and the switching pattern SW. The connection electrode EP2 may be spaced apart from the lower electrode EP1 with the variable resistance pattern VR interposed therebetween. The connection electrode EP2 may electrically connect the variable resistance pattern VR and the switching pattern SW, and may prevent the variable resistance pattern VR from being in direct contact with the switching pattern SW. For example, the connection electrode EP2 may include at least one of W, Ti, Al, Cu, C, CN, TiN, TiAlN, TiSiN, TiCN, WN, CoSiN, WSiN, TaN, TaCN, and TaSiN.

Each of the memory cells MC may include an upper electrode EP3 disposed between the switching pattern SW and the corresponding second conductive line CL2. The switching pattern SW may be electrically connected to the corresponding second conductive line CL2 through the upper electrode EP3. The upper electrode EP3 may be spaced apart from the connection electrode EP2 with the switching pattern SW interposed therebetween. In some embodiments, the upper electrode EP3 may have an island shape locally provided at the intersecting point of the corresponding first conductive line CL1 and the corresponding second conductive line CL2. For example, the upper electrode EP3 may include at least one of W, Ti, Al, Cu, C, CN, TiN, TiAlN, TiSiN, TiCN, WN, CoSiN, WSiN, TaN, TaCN, TaSiN, and TiO.

A spacer SR may be provided between the vertical portions VP of the lower electrode EP1. The spacer SR may be provided on sidewalls, facing each other, of the vertical portions VP and may extend along a top surface of the horizontal portion HP of the lower electrode EP1. The spacer SR may have a U-shape when viewed in a cross-sectional view. The horizontal portion HP may extend between the spacer SR and the top surface of the corresponding first conductive line CL1 connected in common to the pair of memory cells MC. The spacer SR may include poly-crystalline silicon or silicon oxide.

A filling insulating structure 130 may be disposed between the pair of memory cells MC. The filling insulating structure 130 may be disposed between the vertical portions VP of the lower electrode EP1. The spacer SR may be disposed between each of the vertical portions VP and the filling insulating structure 130, and between the horizontal portion HP and the filling insulating structure 130. The filling insulating structure 130 may extend between the variable resistance patterns VR of the pair of memory cells MC, and between the connection electrodes EP2 of the pair of memory cells MC. The filling insulating structure 130 may include a first filling insulating pattern 134 between the pair of memory cells MC, and a second filling insulating pattern 132 disposed between the first filling insulating pattern 134 and each of the pair of memory cells MC. The first filling insulating pattern 134 may be disposed between the vertical portions VP of the lower electrode EP1, and may extend between the variable resistance patterns VR of the pair of memory cells MC, and between the connection electrodes EP2 of the pair of memory cells MC. The second filling insulating pattern 132 may be disposed between the first filling insulating pattern 134 and each of the vertical portions VP, and between the first filling insulating pattern 134 and the horizontal portion HP. The spacer SR may be disposed between each of the vertical portions VP and the second filling insulating pattern 132, and between the horizontal portion HP and the second filling insulating pattern 132. The second filling insulating pattern 132 may extend between the first filling insulating pattern 134 and the variable resistance pattern VR of each of the pair of memory cells MC, and between the first filling insulating pattern 134 and the connection electrode EP2 of each of the pair of memory cells MC. The second filling insulating pattern 132 may have a U-shape when viewed in a cross-sectional view.

The first filling insulating pattern 134 may include a different material from that of the second filling insulating pattern 132. The first filling insulating pattern 134 may include a material of which an etch resistance is greater than that of the second filling insulating pattern 132. The first filling insulating pattern 134 may include at least one of a carbon element and an oxygen element. For example, the first filling insulating pattern 134 may include at least one of carbon-containing silicon nitride (e.g., SiCN), carbon-containing silicon oxide (e.g., SiOC), silicon oxide, and silicon oxynitride, and the second filling insulating pattern 132 may include silicon nitride. In some embodiments, a thickness 134T of the first filling insulating pattern 134 may be less than a thickness 132T of the second filling insulating pattern 132. In other embodiments, the thickness 134T of the first filling insulating pattern 134 may be greater than the thickness 132T of the second filling insulating pattern 132.

Insulating structures 140 may be disposed on the lower interlayer insulating layer 110, and may extend in the first direction D1. The insulating structures 140 may be spaced apart from one another in the second direction D2. Each of the insulating structures 140 may be disposed on the lower interlayer insulating layer 110 between a pair of the first conductive lines CL1 adjacent to each other. Each of the insulating structures 140 may be disposed between a pair of the memory cells MC adjacent to each other in the second direction D2.

Referring to FIGS. 4B and 5, each of the insulating structures 140 may include a first insulating pattern 144 between the pair of memory cells MC, and a second insulating pattern 142 disposed between the first insulating pattern 144 and each of the pair of memory cells MC. The second insulating pattern 142 may extend between the first insulating pattern 144 and the lower interlayer insulating layer 110. The second insulating pattern 142 may have a U-shape when viewed in a cross-sectional view in the second direction D2.

The first insulating pattern 144 may be disposed between the lower electrodes EP1 of the pair of memory cells MC, and may extend between the variable resistance patterns VR of the pair of memory cells MC, and between the connection electrodes EP2 of the pair of memory cells MC. The first insulating pattern 144 may be disposed on one sidewall EP1_S of the lower electrode EP1 of each of the pair of memory cells MC, and may extend onto one sidewall VR_S of the variable resistance pattern VR and one sidewall EP2_S of the connection electrode EP2 of each of the pair of memory cells MC. The second insulating pattern 142 may be disposed between the first insulating pattern 144 and the sidewall EP1_S of the lower electrode EP1 of each of the pair of memory cells MC, and may extend between the first insulating pattern 144 and the sidewall VR_S of the variable resistance pattern VR of each of the pair of memory cells MC and between the first insulating pattern 144 and the sidewall EP2_S of the connection electrode EP2 of each of the pair of memory cells MC.

The lower interlayer insulating layer 110 may have a top surface 110Ur recessed toward the inside thereof. The insulating structure 140 may be disposed on the recessed top surface 110Ur of the lower interlayer insulating layer 110. The second insulating pattern 142 may be disposed between the recessed top surface 110Ur of the lower interlayer insulating layer 110 and a bottom surface 144B of the first insulating pattern 144, and may extend along the recessed top surface 110Ur of the lower interlayer insulating layer 110 and the bottom surface 144B of the first insulating pattern 144. In some embodiments, the first insulating pattern 144 may include a void (or seam) 200 formed therein. The void 200 may extend in the third direction D3.

The first insulating pattern 144 may include a different material from that of the second insulating pattern 142. The first insulating pattern 144 may include a material of which an etch resistance is greater than that of the second insulating pattern 142. The first insulating pattern 144 may include at least one of a carbon element and an oxygen element. For example, the first insulating pattern 144 may include at least one of carbon-containing silicon nitride (e.g., SiCN), carbon-containing silicon oxide (e.g., SiOC), silicon oxide, and silicon oxynitride, and the second insulating pattern 142 may include silicon nitride. In some embodiments, a thickness 144T of the first insulating pattern 144 may be less than a thickness 142T of the second insulating pattern 142. In other embodiments, the thickness 144T of the first insulating pattern 144 may be greater than the thickness 142T of the second insulating pattern 142.

Referring again to FIGS. 3 and 4A-4B, a mold layer 120 may be disposed between the first conductive lines CL1 and the second conductive lines CL2, and may cover the top surfaces of the first conductive lines CL1. The mold layer 120 may cover the lower electrode EP1, the variable resistance pattern VR and the connection electrode EP2 of each of the memory cells MC. The filling insulating structure 130 and the insulating structures 140 may be disposed in the mold layer 120. A top surface 120U of the mold layer 120 may be substantially coplanar with a top surface 130U of the filling insulating structure 130 and top surfaces 140U of the insulating structures 140. For example, the mold layer 120 may include at least one of silicon oxide, silicon nitride, and silicon oxynitride. An upper interlayer insulating layer 150 may be disposed on the mold layer 120, the filling insulating structure 130 and the insulating structures 140. The upper interlayer insulating layer 150 may cover the top surface 120U of the mold layer 120, the top surface 130U of the filling insulating structure 130, and the top surfaces 140U of the insulating structures 140. The upper interlayer insulating layer 150 may cover the switching pattern SW and the upper electrode EP3 of each of the memory cells MC. For example, the upper interlayer insulating layer 150 may include at least one of silicon oxide, silicon nitride, and silicon oxynitride. The second conductive lines CL2 may be disposed on the upper interlayer insulating layer 150.

FIGS. 6A-6B to 13A-13B are cross-sectional views corresponding to the lines I-I' and II-II' of FIG. 3 to illustrate a method of manufacturing a variable resistance memory device according to some embodiments. FIG. 14 is a conceptual view illustrating an example of a deposition apparatus used to form a filling insulating structure and an insulating structure according to some embodiments. Hereinafter, the descriptions to the same features as mentioned with reference to FIGS. 1 to 5 will be omitted or mentioned briefly for the purpose of ease and convenience in explanation.

Referring to FIGS. 3 and 6A-6B, first conductive lines CL1 and a lower interlayer insulating layer 110 may be formed on a substrate 100. The first conductive lines CL1 may extend in the first direction D1, and may be spaced apart from one another in the second direction D2. The lower interlayer insulating layer 110 may be formed to cover the first conductive lines CL1, and may expose top surfaces of the first conductive lines CL1. A mold layer 120 may be formed on the lower interlayer insulating layer 110 and the top surfaces of the first conductive lines CL1. The mold layer 120 may include, for example, silicon nitride. First trenches T1 may be formed in the mold layer 120. The first trenches T1 may be formed to intersect the first conductive lines CL1. The first trenches T1 may extend in the second direction D2, and may be spaced apart from one another in the first direction D1. Each of the first trenches T1 may expose portions of the top surfaces of the first conductive lines CL1 and portions of a top surface of the lower interlayer insulating layer 110, which are alternately arranged in the second direction D2.

Referring to FIGS. 3 and 7A-7B, a lower electrode layer 160 may be formed on the mold layer 120 to partially fill each of the first trenches T1. The lower electrode layer 160 may cover an inner surface of each of the first trenches T1 with a substantially uniform thickness. A spacer layer 162 may be formed on the lower electrode layer 160 to partially fill each of the first trenches T1. The spacer layer 162 may cover the inner surface of each of the first trenches T1 with a substantially uniform thickness. The lower electrode layer 160 may be disposed between the spacer layer 162 and the inner surface of each of the first trenches T1, and may extend between the mold layer 120 and the spacer layer 162.

A filling insulating layer 130L may be formed on the spacer layer 162 to fill a remaining portion of each of the first trenches T1. The spacer layer 162 may be disposed between the lower electrode layer 160 and the filling insulating layer 130L. The filling insulating layer 130L may include a first filling insulating layer 134L, a second filling insulating layer 132L, and a third filling insulating layer 136L. The second filling insulating layer 132L may be formed on the spacer layer 162 to partially fill each of the first trenches T1. The first filling insulating layer 134L may be formed on the second filling insulating layer 132L to fill a remaining portion of each of the first trenches T1. The second filling insulating layer 132L may be disposed between the spacer layer 162 and the first filling insulating layer 134L. The third filling insulating layer 136L may be formed to cover the first filling insulating layer 134L. The first filling insulating layer 134L may be disposed between the second filling insulating layer 132L and the third filling insulating layer 136L.

The first filling insulating layer 134L may include a different material from those of the second filling insulating layer 132L and the third filling insulating layer 136L. The first filling insulating layer 134L may include a material of which an etch resistance is greater than those of the second filling insulating layer 132L and the third filling insulating layer 136L. For example, the second and third filling insulating layers 132L and 136L may include silicon nitride, and the first filling insulating layer 134L may include at least one of carbon-containing silicon nitride (e.g., SiCN), carbon-containing silicon oxide (e.g., SiOC), silicon oxide, and silicon oxynitride. The first to third filling insulating layers 134L, 132L and 136L may be formed by, for example, a plasma enhanced atomic layer deposition (plasma enhanced ALD) method, and may be deposited at a temperature of about 400 degrees Celsius or less.

In detail, referring to FIGS. 7A-7B and 14, the formation of the second filling insulating layer 132L may include providing the substrate 100 having the spacer layer 162 into a chamber 1100 of a deposition apparatus 1000. The chamber 1100 may include a first region R1, a second region R2, a third region R3, and a fourth region R4, which are different from one another. The substrate 100 may be moved to sequentially pass through the first to fourth regions R1, R2, R3 and R4. The substrate 100 may be provided in the first region R1 of the chamber 1100, and a first source gas SG1 may be provided onto the substrate 100. The first source gas SG1 may be a silicon-containing gas (e.g., dichlorosilane (DCS)). Since the first source gas SG1 is provided, a source layer (e.g., a silicon layer) may be formed on the substrate 100. The substrate 100 may be moved from the first region R1 into the second region R2, and then may be moved from the second region R2 into the third region R3. Plasma PL (e.g., hydrogen plasma) may be provided onto the substrate 100 in the second and third regions R2 and R3, and thus impurities (e.g., chlorine) in the source layer may be removed by the plasma PL. The substrate 100 may be moved from the third region R3 into the fourth region R4, and a second source gas SG2 may be provided onto the substrate 100 in the fourth region R4. The second source gas SG2 may be a nitrogen-containing gas (e.g., $NH_3$). The second filling insulating layer 132L may be formed on the substrate 100 by reaction of the source layer and the second source gas SG2.

The formation of the first filling insulating layer 134L may include providing the substrate 100 having the second filling insulating layer 132L into the chamber 1100 of the deposition apparatus 1000. The substrate 100 may be provided in the first region R1 of the chamber 1100, and the first source gas SG1 may be provided onto the substrate 100. The first source gas SG1 may be a silicon-containing gas. Since the first source gas SG1 is provided, the source layer may be formed on the substrate 100. The substrate 100 may be moved from the first region R1 into the second region R2, and then may be moved from the second region R2 into the third region R3. The plasma PL may be provided onto the substrate 100 in the second and third regions R2 and R3, and thus impurities in the source layer may be removed by the plasma PL. The substrate 100 may be moved from the third region R3 into the fourth region R4, and at least one of the second source gas SG2 and a third source gas SG3 may be provided onto the substrate 100 in the fourth region R4. The second source gas SG2 may be a nitrogen-containing gas, and the third source gas SG3 may be a gas containing at least one of carbon and oxygen, e.g., $C_2H_4O_2$. The first filling insulating layer 134L may be formed on the substrate 100 by reaction of the source layer and at least one of the second and third source gases SG2 and SG3.

The formation of the third filling insulating layer 136L may include providing the substrate 100 having the first filling insulating layer 134L into the chamber 1100 of the deposition apparatus 1000. The third filling insulating layer 136L may be formed by substantially the same method as the second filling insulating layer 132L. In the case that the first to third filling insulating layers 134L, 132L and 136L are formed by the plasma enhanced ALD method at a temperature of about 400 degrees Celsius or less, a deposition rate of the first filling insulating layer 134L may be less than those of the second and third filling insulating layers 132L and 136L. In this case, for improvement of mass production of a variable resistance memory device, the first filling insulating layer 134L may be formed to have a thickness thinner than those of the second and third filling insulating layers 132L and 136L. As a result, as described referring to FIG. 4A, the thickness 134T of the first filling insulating pattern 134 may be less than the thickness 132T of the second filling insulating pattern 132.

Figure 8A:
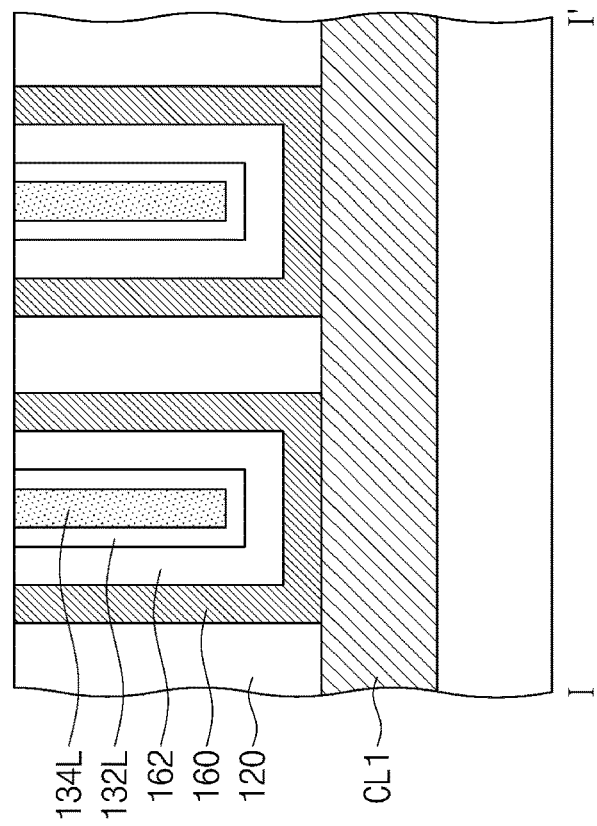
Figure 8B:
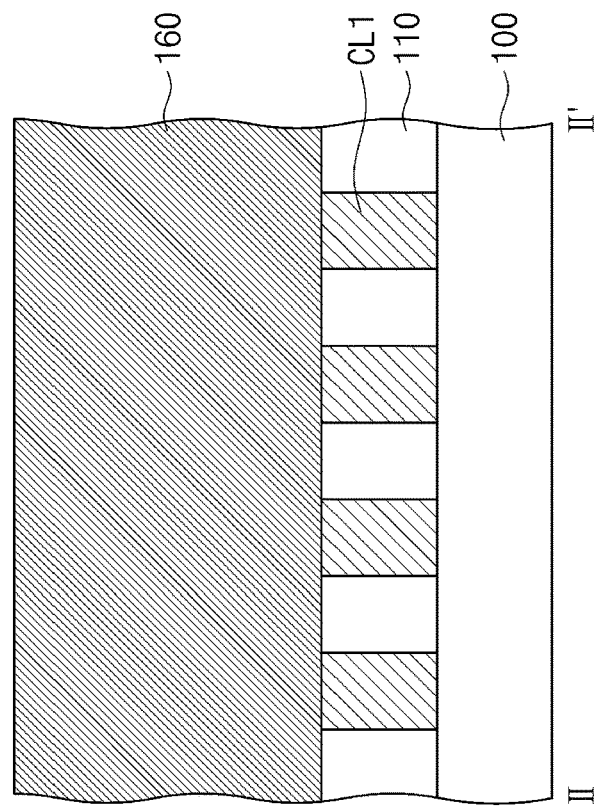

Referring to FIGS. 3 and 8A-8B, a planarization process may be performed on the filling insulating layer 130L. The planarization process may be performed until a top surface of the mold layer 120 is exposed. The filling insulating layer 130L, the spacer layer 162 and the lower electrode layer 160 may be sequentially planarized by the planarization process. By the planarization process, remaining portions of the first filling insulating layer 134L, the second filling insulating layer 132L, the spacer layer 162 and the lower electrode layer 160 may locally remain in each of the first trenches T1. In some embodiments, the third filling insulating layer 136L may be removed by the planarization process.

Figure 9A:
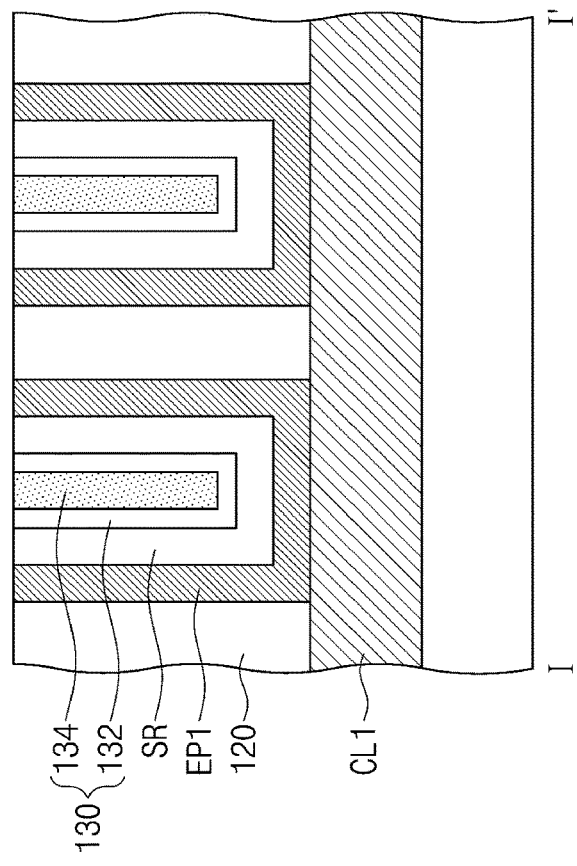
Figure 9B:
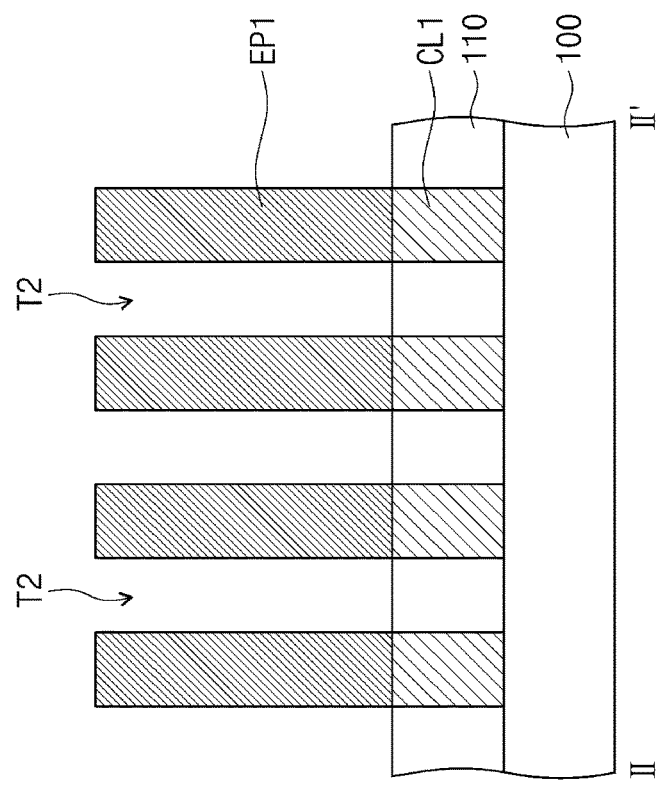

Referring to FIGS. 3 and 9A-9B, second trenches T2 may be formed in the mold layer 120 to intersect the first trenches T1. The second trenches T2 may extend in the first direction D1, and may be spaced apart from one another in the second direction D2. Each of the second trenches T2 may expose the lower interlayer insulating layer 110 between a pair of the first conductive lines CL1 adjacent to each other in the second direction D2. The second trenches T2 may be formed by patterning the mold layer 120 and the remaining portions of the first filling insulating layer 134L, the second filling insulating layer 132L, the spacer layer 162 and the lower electrode layer 160. In some embodiments, as illustrated in FIG. 5, an upper portion of the lower interlayer insulating layer 110 between the pair of first conductive lines CL1 may be recessed when the second trenches T2 are formed. Thus, the lower interlayer insulating layer 110 may have a top surface 110Ur recessed toward the inside thereof. In this case, the remaining portion of the lower electrode layer 160 may be etched enough to prevent electrical short between separate lower electrodes EP1.

The remaining portion of the lower electrode layer 160 may be divided into lower electrodes EP1 spaced apart from one another in the second direction D2 by the second trenches T2, and the remaining portion of the spacer layer 162 may be divided into spacers SR spaced apart from one another in the second direction D2 by the second trenches T2. The remaining portion of the first filling insulating layer 134L may be divided into first filling insulating patterns 134 spaced apart from one another in the second direction D2 by the second trenches T2, and the remaining portion of the second filling insulating layer 132L may be divided into second filling insulating patterns 132 spaced apart from one another in the second direction D2 by the second trenches T2. Each of the first filling insulating patterns 134 and each of the second filling insulating patterns 132 may constitute a filling insulating structure 130.

Figure 10A:
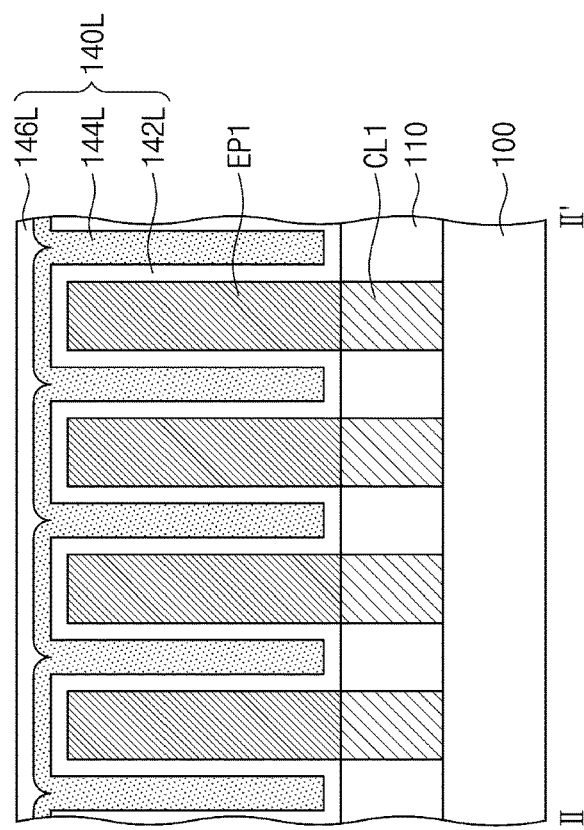
Figure 10B:
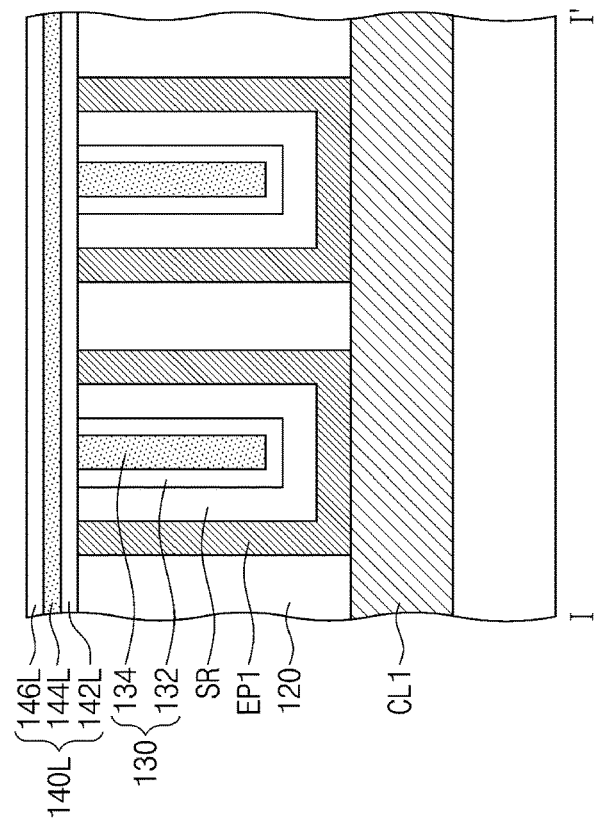

Referring to FIGS. 3 and 10A-10B, an insulating layer 140L may be formed on the mold layer 120 to fill the second trenches T2. The insulating layer 140L may include a first insulating layer 144L, a second insulating layer 142L, and a third insulating layer 146L. The second insulating layer 142L may be formed on the mold layer 120 to partially fill each of the second trenches T2. The second insulating layer 142L may be formed to cover an inner surface of each of the second trenches T2 with a substantially uniform thickness. The first insulating layer 144L may be formed on the second insulating layer 142L to fill a remaining portion of each of the second trenches T2. The third insulating layer 146L may be formed to cover the first insulating layer 144L. The first insulating layer 144L may be disposed between the second insulating layer 142L and the third insulating layer 146L.

The first insulating layer 144L may include a different material from those of the second insulating layer 142L and the third insulating layer 146L. The first insulating layer 144L may include a material of which an etch resistance is greater than those of the second insulating layer 142L and the third insulating layer 146L. For example, the second and third insulating layers 142L and 146L may include silicon nitride, and the first insulating layer 144L may include at least one of carbon-containing silicon nitride (e.g., SiCN), carbon-containing silicon oxide (e.g., SiOC), silicon oxide, and silicon oxynitride. The first to third insulating layers 144L, 142L and 146L may be formed by, for example, a plasma enhanced ALD method, and may be deposited at a temperature of about 400 degrees Celsius or less.

In detail, referring to FIGS. 10A-10B and 14, the formation of the second insulating layer 142L may include providing the substrate 100 having the second trenches T2 into the chamber 1100 of the deposition apparatus 1000. The substrate 100 may be provided in the first region R1 of the chamber 1100, and the first source gas SG1 may be provided onto the substrate 100. The first source gas SG1 may be a silicon-containing gas. Since the first source gas SG1 is provided, the source layer may be formed on the substrate 100. The substrate 100 may be moved from the first region R1 into the second region R2, and then may be moved from the second region R2 into the third region R3. The plasma PL may be provided onto the substrate 100 in the second and third regions R2 and R3, and thus impurities in the source layer may be removed by the plasma PL. The substrate 100 may be moved from the third region R3 into the fourth region R4, and the second source gas SG2 may be provided onto the substrate 100 in the fourth region R4. The second source gas SG2 may be a nitrogen-containing gas. The second insulating layer 142L may be formed on the substrate 100 by reaction of the source layer and the second source gas SG2.

The formation of the first insulating layer 144L may include providing the substrate 100 having the second insulating layer 142L into the chamber 1100 of the deposition apparatus 1000. The substrate 100 may be provided in the first region R1 of the chamber 1100, and the first source gas SG1 may be provided onto the substrate 100. The first source gas SG1 may be a silicon-containing gas. Since the first source gas SG1 is provided, the source layer may be formed on the substrate 100. The substrate 100 may be moved from the first region R1 into the second region R2, and then may be moved from the second region R2 into the third region R3. The plasma PL may be provided onto the substrate 100 in the second and third regions R2 and R3, and thus impurities in the source layer may be removed by the plasma PL. The substrate 100 may be moved from the third region R3 into the fourth region R4, and at least one of the second source gas SG2 and the third source gas SG3 may be provided onto the substrate 100 in the fourth region R4. The second source gas SG2 may be a nitrogen-containing gas, and the third source gas SG3 may be a gas containing at least one of carbon and oxygen. The first insulating layer 144L may be formed on the substrate 100 by reaction of the source layer and at least one of the second and third source gases SG2 and SG3.

The formation of the third insulating layer 146L may include providing the substrate 100 having the first insulating layer 144L into the chamber 1100 of the deposition apparatus 1000. The third insulating layer 146L may be formed by substantially the same method as the second insulating layer 142L. In the case that the first to third insulating layers 144L, 142L and 146L are formed by the plasma enhanced ALD method at a temperature of about 400 degrees Celsius or less, a deposition rate of the first insulating layer 144L may be less than those of the second and third insulating layers 142L and 146L. In this case, for improvement of mass production of a variable resistance memory device, the first insulating layer 144L may be formed to have a thickness thinner than those of the second and third insulating layers 142L and 146L. As a result, as described referring to FIG. 4B, the thickness 144T of the first insulating pattern 144 may be less than the thickness 142T of the second insulating pattern 142.

Referring again to FIGS. 3 and 10A-10B, the first insulating layer 144L may be formed to completely fill the remaining portion of each of the second trenches T2. However, embodiments are not limited thereto. As illustrated in FIG. 5, the void 200 may be formed in the first insulating layer 144L in each of the second trenches T2 during the formation of the first insulating layer 144L.

Figure 11A:
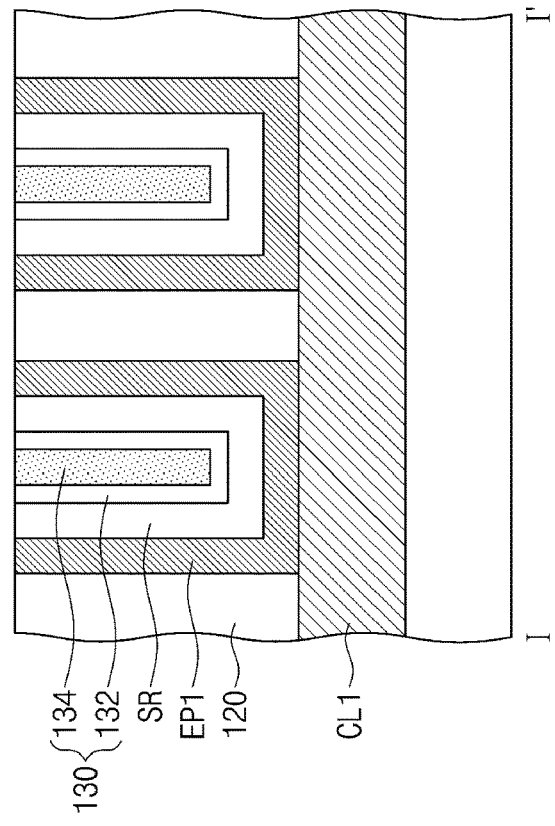
Figure 11B:
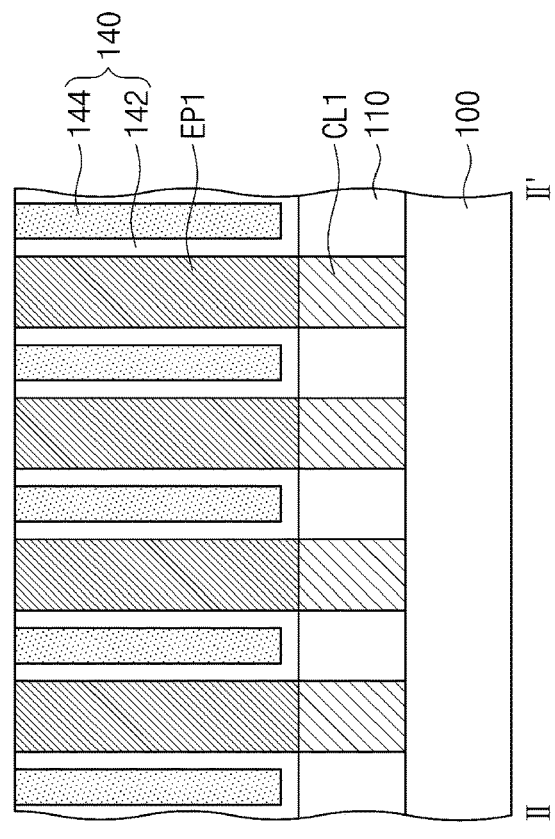

Referring to FIGS. 3 and 11A-11B, a planarization process may be performed on the insulating layer 140L. The planarization process may be performed until a top surface of the mold layer 120 is exposed. By the planarization process, the third insulating layer 146L may be removed, and remaining portions of the first and second insulating layers 144L and 142L may locally remain in each of the second trenches T2. Insulating structures 140 may be respectively formed in the second trenches T2 by the planarization process. Each of the insulating structures 140 may include a first insulating pattern 144 disposed in each of the second trenches T2, and a second insulating pattern 142 disposed between the first insulating pattern 144 and the inner surface of each of the second trenches T2. The first insulating pattern 144 may correspond to the remaining portion of the first insulating layer 144L which remains in each of the second trenches T2, and the second insulating pattern 142 may correspond to the remaining portion of the second insulating layer 142L which remains in each of the second trenches T2.

Figure 12A:
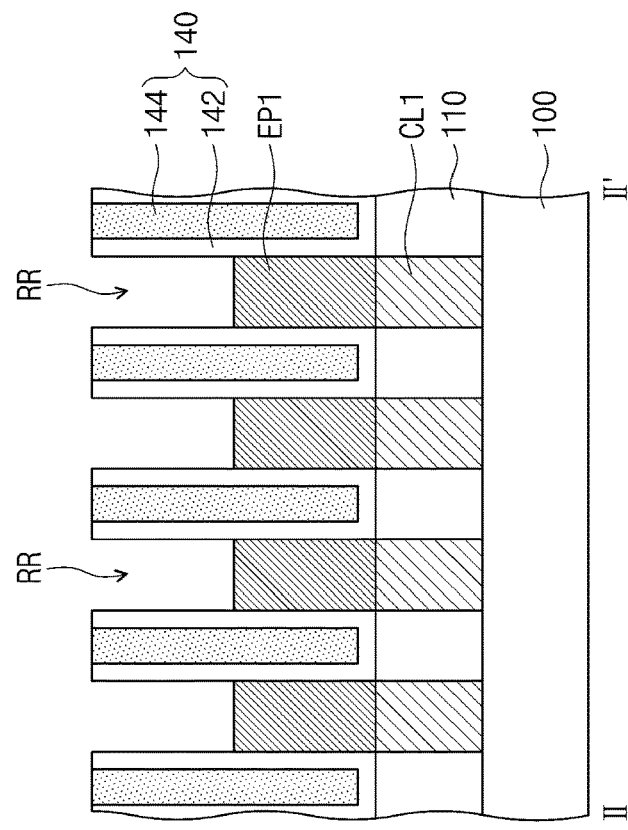
Figure 12B:
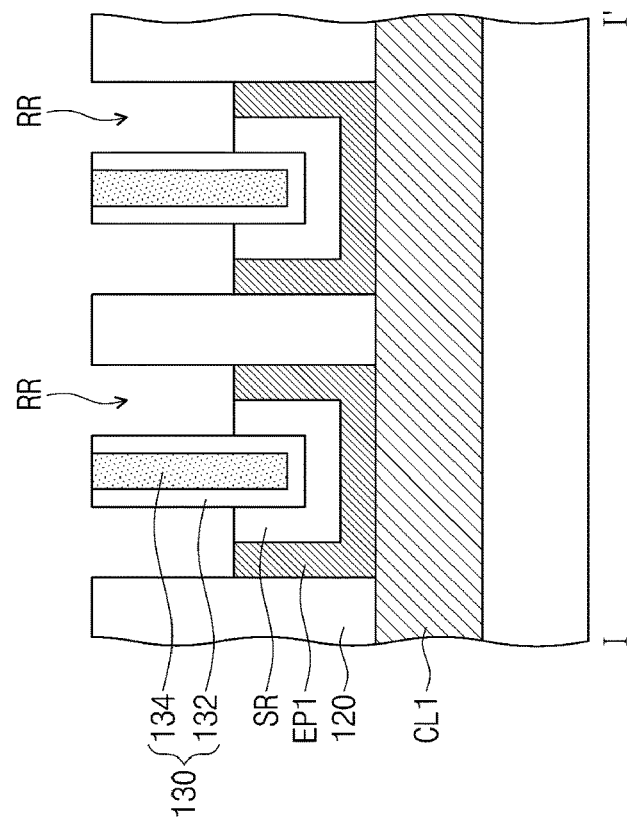

Referring to FIGS. 3 and 12A-12B, recess regions RR may be formed in the mold layer 120. The recess regions RR may be formed by removing upper portions of the lower electrodes EP1 and upper portions of the spacers SR. For example, the formation of the recess regions RR may include performing a wet etching process to etch the upper portions of the lower electrodes EP1 and the upper portions of the spacers SR. An etch resistance of the first filling insulating pattern 134 with respect to the wet etching process may be greater than an etch resistance of the second filling insulating pattern 132 with respect to the wet etching process. In other words, in the wet etching process, an etch rate of the first filling insulating pattern 134 may be less than an etch rate of the second filling insulating pattern 132. Thus, a loss of the filling insulating structure 130 during the wet etching process may be reduced or minimized. In addition, an etch resistance of the first insulating pattern 144 with respect to the wet etching process may be greater than an etch resistance of the second insulating pattern 142 with respect to the wet etching process. In other words, in the wet etching process, an etch rate of the first insulating pattern 144 may be less than an etch rate of the second insulating pattern 142. Thus, a loss of the insulating structures 140 during the wet etching process may be reduced or minimized. The recess regions RR may expose sidewalls of the filling insulating structure 130 and sidewalls of the insulating structures 140. The recess regions RR may be spaced apart from one another in the first direction D1 and the second direction D2.

Figure 13A:
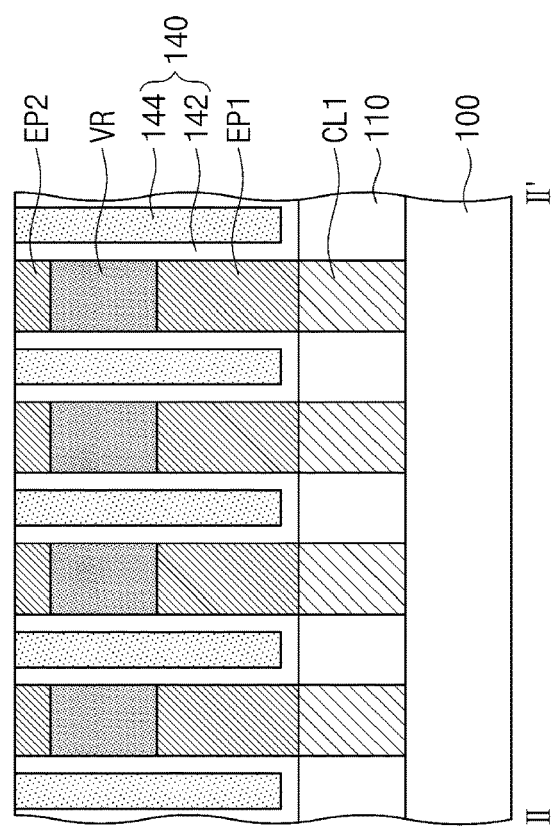
Figure 13B:
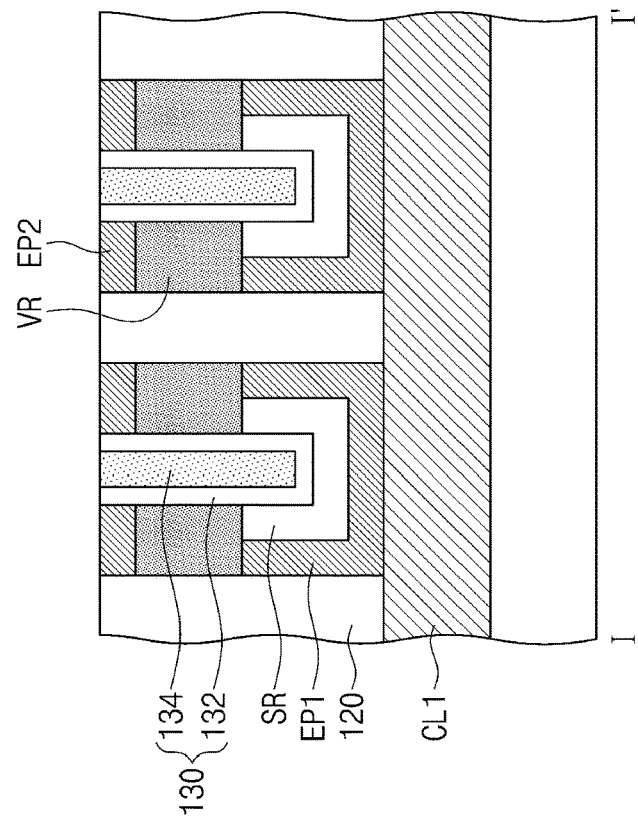
Figure 14:
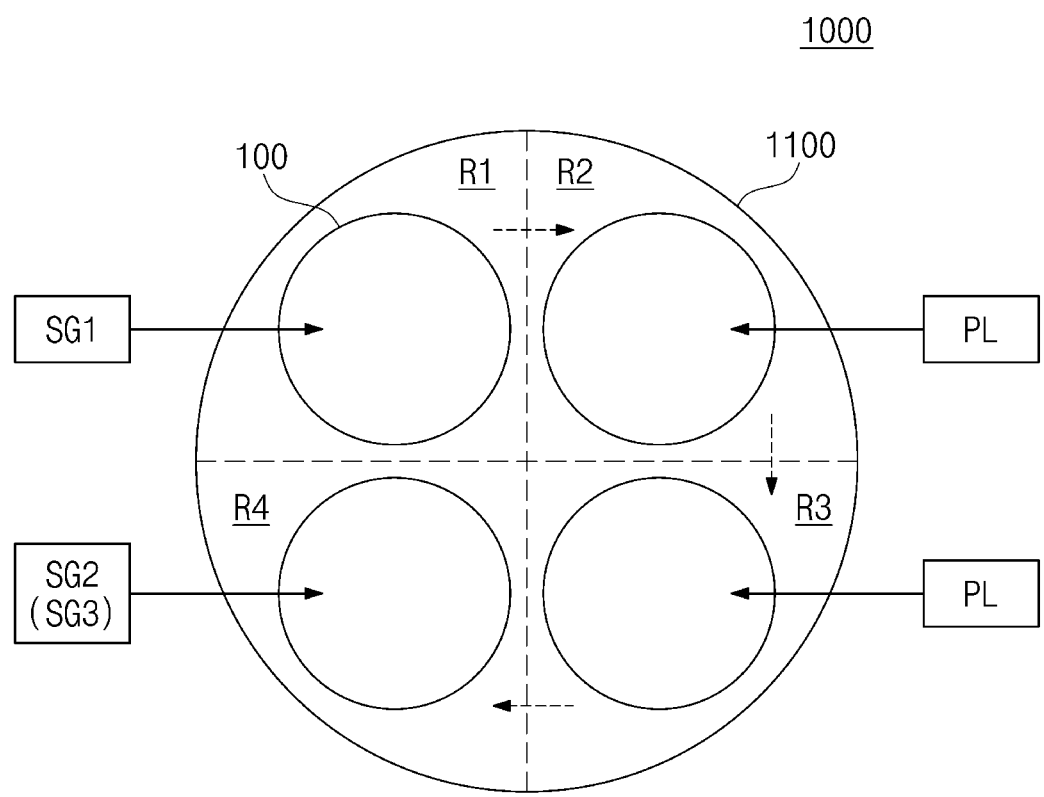
FIG. 14 is a conceptual view illustrating an example of a deposition apparatus used to form a filling insulating structure and an insulating structure according to some embodiments.

Referring to FIGS. 3 and 13A-13B, variable resistance patterns VR may be formed in the recess regions RR, respectively. Each of the variable resistance patterns VR may be formed to fill a portion of each of the recess regions RR (e.g., a lower portion of each of the recess regions RR). Connection electrodes EP2 may be formed in the recess regions RR, respectively, and each of the connection electrodes EP2 may be formed to fill a remaining portion of each of the recess regions RR (e.g., an upper portion of each of the recess regions RR). The connection electrodes EP2 may be formed on the variable resistance patterns VR, respectively.

Referring again to FIGS. 3 and 4A-4B, switching patterns SW may be formed on the mold layer 120. The switching patterns SW may be formed on the connection electrodes EP2, respectively. Upper electrodes EP3 may be formed on the switching patterns SW, respectively. An upper interlayer insulating layer 150 may be formed on the mold layer 120 to cover the switching patterns SW and the upper electrodes EP3. The upper interlayer insulating layer 150 may cover a top surface 130U of the filling insulating structure 130 and top surfaces 140U of the insulating structures 140. Second conductive lines CL2 may be formed on the upper interlayer insulating layer 150. The second conductive lines CL2 may extend in the second direction D2, and may be spaced apart from one another in the first direction D1.

When the memory cell stacks MCA described with reference to FIGS. 1 and 2 are stacked on the substrate 100, insulating layers between the memory cells MC in an upper memory cell stack MCA may be deposited at a relatively low temperature to prevent deterioration of the variable resistance patterns VR and/or the switching patterns SW disposed in a lower memory cell stack MCA. When the insulating layers are deposited at low temperature, an etch resistance of the insulating layers may be relatively weakened during the wet etching process for forming the recess regions RR. In this case, a loss of the insulating layers may be increased during the wet etching process, and thus a defect (e.g., a bridge) may occur between the variable resistance patterns VR (or the connection electrodes EP2) respectively formed in the recess regions RR adjacent to each other.

However, according to the embodiments, the filling insulating structure 130 and the insulating structures 140 may be disposed between the memory cells MC. The filling insulating structure 130 and the insulating structures 140 may be formed using the deposition processes performed at relatively low temperatures (e.g., temperatures of about 400 degrees Celsius or less). Thus, it is possible to minimize deterioration of the variable resistance patterns VR and/or the switching patterns SW disposed in an underlying memory cell stack MCA. In addition, the etch resistance of the first filling insulating pattern 134 may be greater than the etch resistance of the second filling insulating pattern 132 in the wet etching process for forming the recess regions RR, and the etch resistance of the first insulating pattern 144 may be greater than the etch resistance of the second insulating pattern 142 in the wet etching process. Thus, a loss of the filling insulating structure 130 and the insulating structures 140 may be reduced or minimized during the wet etching process. As a result, it is possible to minimize occurrence of a defect between the variable resistance patterns VR (or the connection electrodes EP2) respectively formed in the recess regions RR adjacent to each other. Thus, it is possible to provide the variable resistance memory device which has improved electrical characteristics and of which defects are minimized, and the method of manufacturing the same.

Figure 15A:
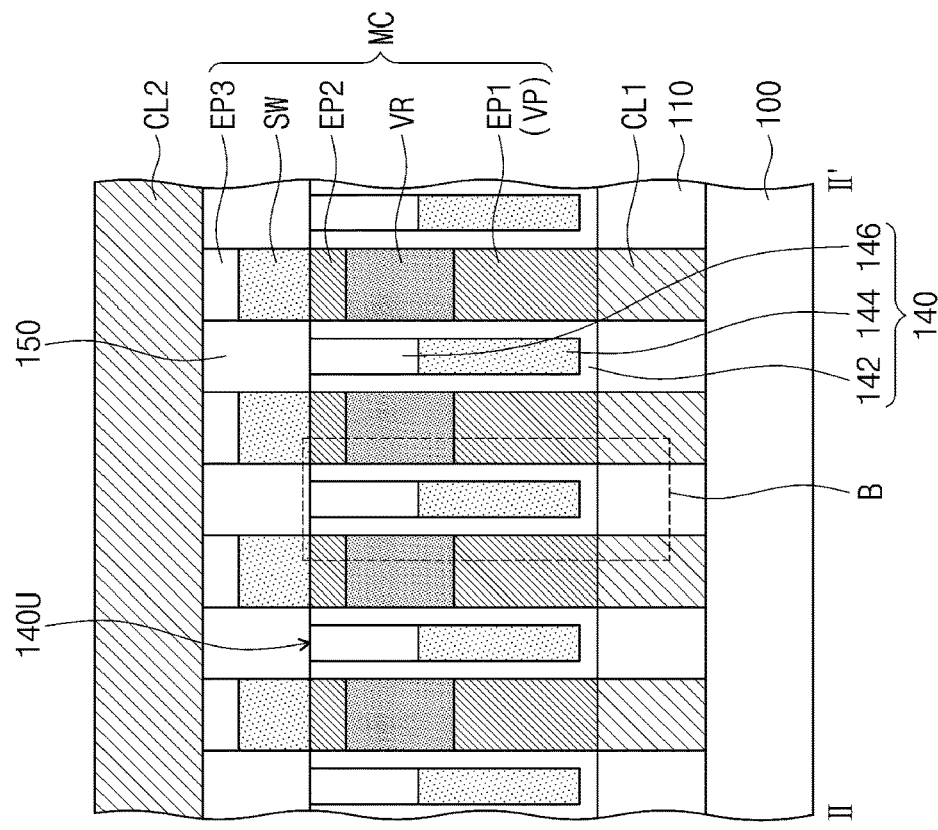
FIG. 15A-15B are cross-sectional views taken along the lines I-I' and II-II' of FIG. 3, respectively, to illustrate a variable resistance memory device according to some embodiments.
Figure 15B:
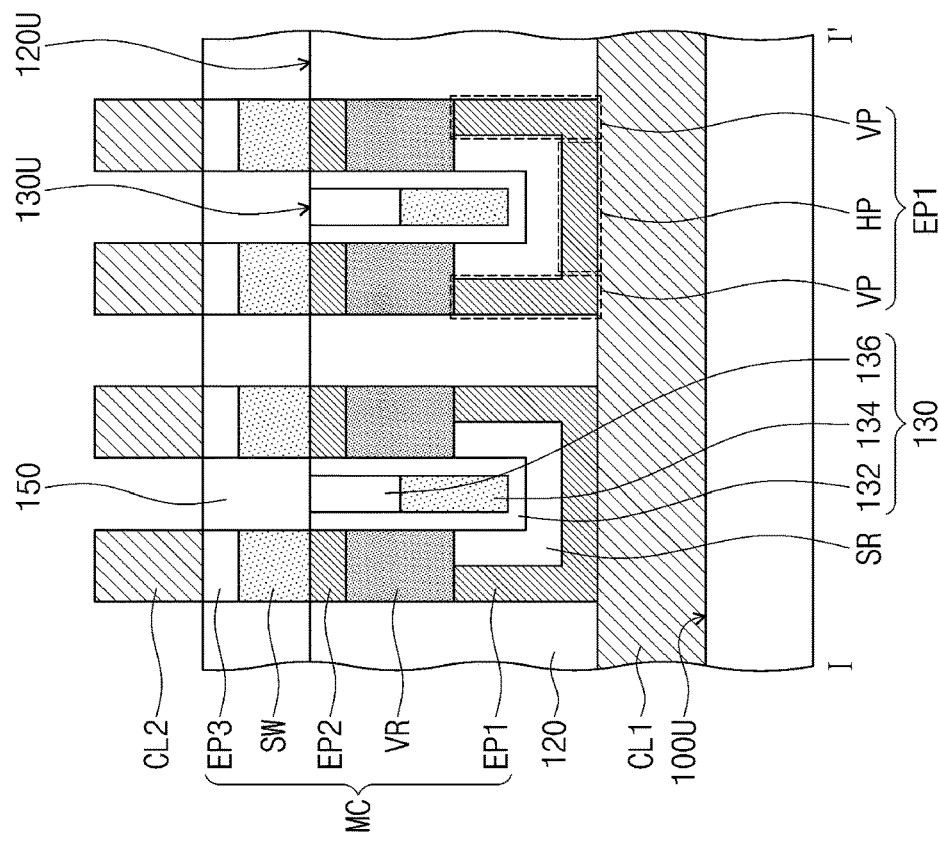
Figure 16A:
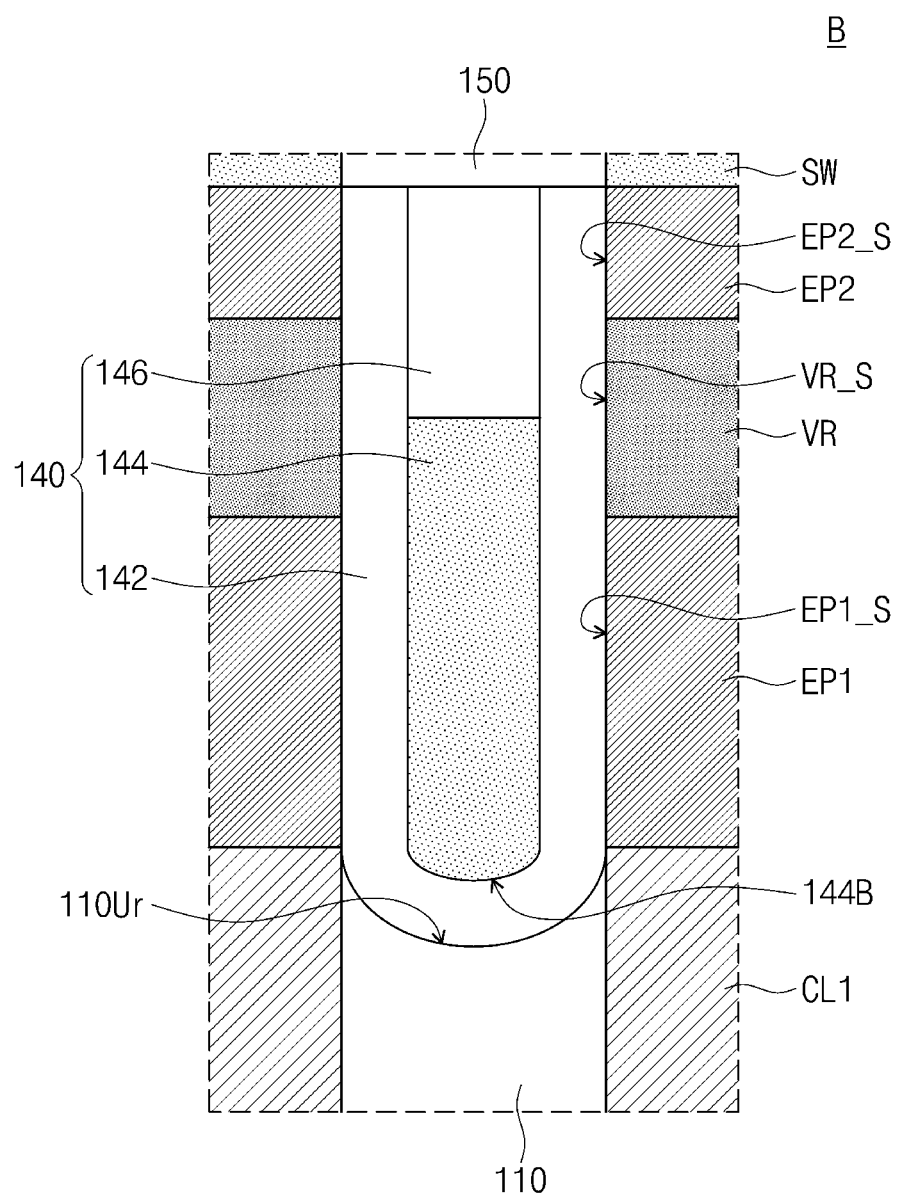
FIG. 16A is an enlarged view of a portion 'B' of FIG. 15B.

FIGS. 15A-15B is cross-sectional views taken along the lines I-I' and II-II' of FIG. 3, respectively, to illustrate a variable resistance memory device according to some embodiments. FIG. 16A is an enlarged view of a portion 'B' of FIG. 15B. Hereinafter, differences between the present embodiments and the above embodiments of FIGS. 1 to 5 will be mainly described for the purpose of ease and convenience in explanation.

Referring to FIGS. 3 and 15A, the filling insulating structure 130 may include the first filling insulating pattern 134 between the pair of memory cells MC adjacent to each other in the first direction D1, the second filling insulating pattern 132 disposed between the first filling insulating pattern 134 and each of the pair of memory cells MC, and a third filling insulating pattern 136 on the first filling insulating pattern 134. The third filling insulating pattern 136 may be disposed between the pair of memory cells MC, and the second filling insulating pattern 132 may extend between the third filling insulating pattern 136 and each of the pair of memory cells MC.

The first filling insulating pattern 134 may be disposed between the vertical portions VP of the lower electrode EP1 and may extend between the variable resistance patterns VR of the pair of memory cells MC. The third filling insulating pattern 136 may be disposed between the connection electrodes EP2 of the pair of memory cells MC, and may extend between the variable resistance patterns VR of the pair of memory cells MC so as to be in contact with the first filling insulating pattern 134. The second filling insulating pattern 132 may be disposed between the first filling insulating pattern 134 and each of the vertical portions VP, and between the first filling insulating pattern 134 and the horizontal portion HP. The second filling insulating pattern 132 may extend between the first filling insulating pattern 134 and the variable resistance pattern VR of each of the pair of memory cells MC, between the third filling insulating pattern 136 and the variable resistance pattern VR of each of the pair of memory cells MC, and between the third filling insulating pattern 136 and the connection electrode EP2 of each of the pair of memory cells MC.

The first filling insulating pattern 134 may include a different material from that of the third filling insulating pattern 136. The second filling insulating pattern 132 and the third filling insulating pattern 136 may include the same material. The first filling insulating pattern 134 may include a material of which an etch resistance is greater than those of the second and third filling insulating patterns 132 and 136. For example, the first filling insulating pattern 134 may include at least one of carbon-containing silicon nitride (e.g., SiCN), carbon-containing silicon oxide (e.g., SiOC), silicon oxide, and silicon oxynitride, and the second and third filling insulating patterns 132 and 136 may include silicon nitride.

Referring to FIGS. 3 and 15B, each of the insulating structures 140 may include the first insulating pattern 144 between the pair of memory cells MC adjacent to each other in the second direction D2, the second insulating pattern 142 disposed between the first insulating pattern 144 and each of the pair of memory cells MC, and a third insulating pattern 146 on the first insulating pattern 144. The third insulating pattern 146 may be disposed between the pair of memory cells MC, and the second insulating pattern 142 may extend between the third insulating pattern 146 and each of the pair of memory cells MC. The second insulating pattern 142 may extend between the first insulating pattern 144 and the lower interlayer insulating layer 110.

The first insulating pattern 144 may be disposed between the lower electrodes EP1 of the pair of memory cells MC, and may extend between the variable resistance patterns VR of the pair of memory cells MC. The first insulating pattern 144 may be disposed on one sidewall EP1_S of the lower electrode EP1 of each of the pair of memory cells MC, and may extend onto one sidewall VR_S of the variable resistance pattern VR of each of the pair of memory cells MC. The third insulating pattern 146 may be disposed between the connection electrodes EP2 of the pair of memory cells MC, and may extend between the variable resistance patterns VR of the pair of memory cells MC so as to be in contact with the first insulating pattern 144. The third insulating pattern 146 may be disposed on one sidewall EP2_S of the connection electrode EP2 of each of the pair of memory cells MC, and may extend onto the sidewall VR_S of the variable resistance pattern VR of each of the pair of memory cells MC so as to be in contact with the first insulating pattern 144. The second insulating pattern 142 may be disposed between the first insulating pattern 144 and the sidewall EP1_S of the lower electrode EP1 of each of the pair of memory cells MC, and may extend between the first insulating pattern 144 and the sidewall VR_S of the variable resistance pattern VR of each of the pair of memory cells MC, between the third insulating pattern 146 and the sidewall VR_S of the variable resistance pattern VR of each of the pair of memory cells MC, and between the third insulating pattern 146 and the sidewall EP2_S of the connection electrode EP2 of each of the pair of memory cells MC.

The first insulating pattern 144 may include a different material from that of the third insulating pattern 146. The second insulating pattern 142 and the third insulating pattern 146 may include the same material. The first insulating pattern 144 may include a material of which an etch resistance is greater than those of the second and third insulating patterns 142 and 146. For example, the first insulating pattern 144 may include at least one of carbon-containing silicon nitride (e.g., SiCN), carbon-containing silicon oxide (e.g., SiOC), silicon oxide, and silicon oxynitride, and the second and third insulating patterns 142 and 146 may include silicon nitride.

Figure 16B:
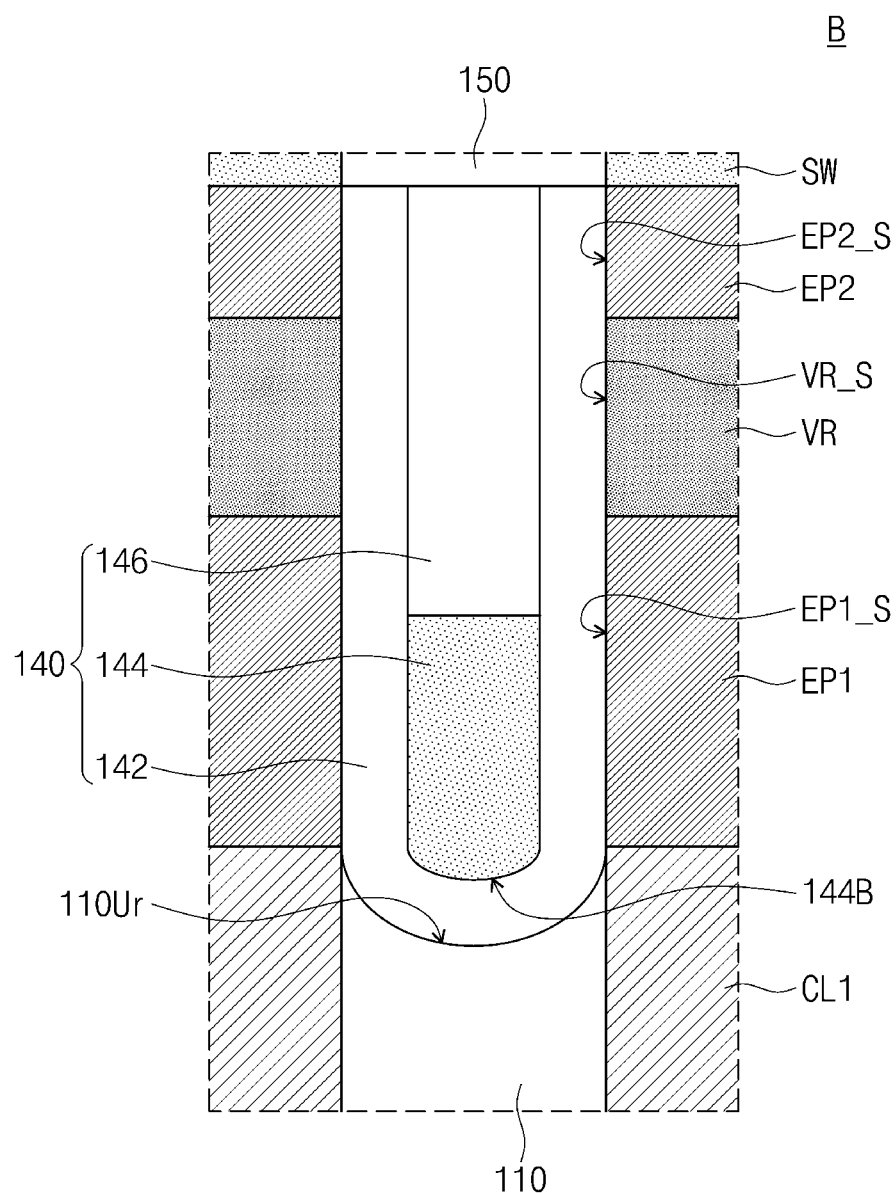
FIGS. 16B and 16C are enlarged views corresponding to the portion 'B' of FIG. 15B to illustrate modified examples of a variable resistance memory device according to some embodiments.
Figure 16C:
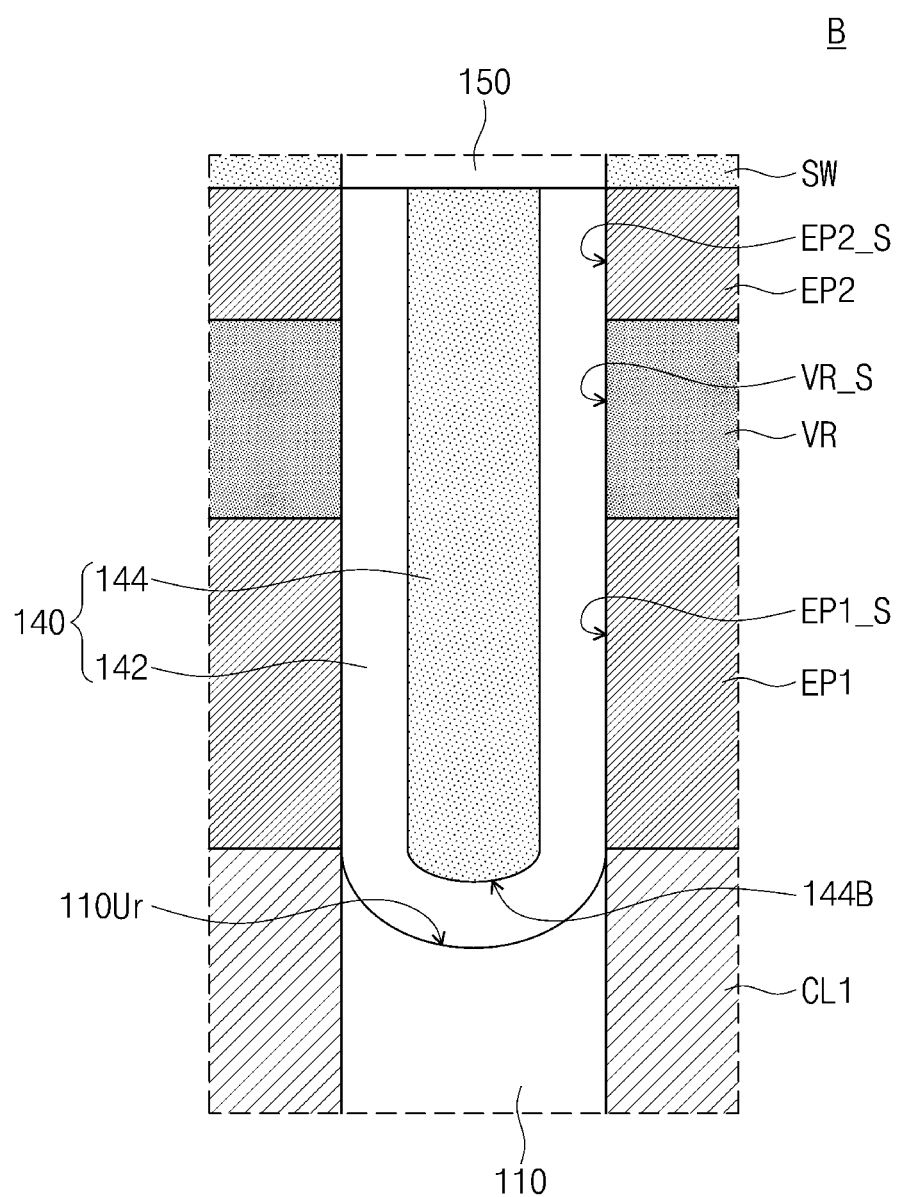

FIGS. 16B and 16C are enlarged views corresponding to the portion 'B' of FIG. 15B to illustrate modified examples of a variable resistance memory device according to some embodiments. Hereinafter, differences between the present embodiment and the above embodiments described with reference to FIGS. 15A-15B and 16A will be mainly described for the purpose of ease and convenience in explanation.

Referring to FIG. 16B, according to a modified example, the first insulating pattern 144 may be disposed between the lower electrodes EP1 of the pair of memory cells MC. The first insulating pattern 144 may be disposed on one sidewall EP1_S of the lower electrode EP1 of each of the pair of memory cells MC. The third insulating pattern 146 may be disposed between the connection electrodes EP2 of the pair of memory cells MC and between the variable resistance patterns VR of the pair of memory cells MC, and may extend between the lower electrodes EP1 of the pair of memory cells MC so as to be in contact with the first insulating pattern 144. The third insulating pattern 146 may be disposed on one sidewall EP2_S of the connection electrode EP2 and one sidewall VR_S of the variable resistance pattern VR of each of the pair of memory cells MC, and may extend onto the sidewall EP1_S of the lower electrode EP1 of each of the pair of memory cells MC. The second insulating pattern 142 may be disposed between the first insulating pattern 144 and the sidewall EP1_S of the lower electrode EP1 of each of the pair of memory cells MC, and may extend between the third insulating pattern 146 and the sidewall VR_S of the variable resistance pattern VR of each of the pair of memory cells MC, and between the third insulating pattern 146 and the sidewall EP2_S of the connection electrode EP2 of each of the pair of memory cells MC.

Referring to FIG. 16C, according to another modified example, the third insulating pattern 146 may be omitted. The first insulating pattern 144 may be disposed between the lower electrodes EP1 of the pair of memory cells MC, and may extend between the variable resistance patterns VR and between the connection electrodes EP2 of the pair of memory cells MC. The first insulating pattern 144 may be disposed on one sidewall EP1_S of the lower electrode EP1 of each of the pair of memory cells MC, and may extend onto one sidewall VR_S of the variable resistance pattern VR and one sidewall EP2_S of the connection electrode EP2 of each of the pair of memory cells MC. The second insulating pattern 142 may be disposed between the first insulating pattern 144 and the sidewall EP1_S of the lower electrode EP1 of each of the pair of memory cells MC, and may extend between the first insulating pattern 144 and the sidewall VR_S of the variable resistance pattern VR of each of the pair of memory cells MC, and between the first insulating pattern 144 and the sidewall EP2_S of the connection electrode EP2 of each of the pair of memory cells MC.

FIGS. 17A-17B to 21A-21B are cross-sectional views corresponding to the lines I-I' and II-II' of FIG. 3, respectively, to illustrate a method of manufacturing a variable resistance memory device according to some embodiments. Hereinafter, differences between the present embodiments and the above embodiments described with reference to FIGS. 6A-6B to 14A-14B will be mainly mentioned for the purpose of ease and convenience in explanation.

Figure 17B:
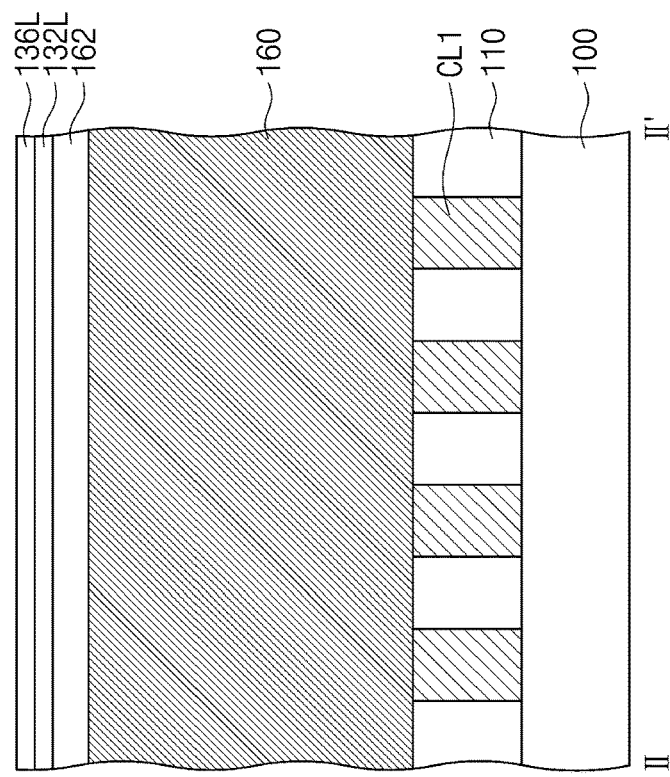
FIGS. 17A-17B to 21A-21B are cross-sectional views corresponding to the lines I-I' and II-II' of FIG. 3, respectively, to illustrate a method of manufacturing a variable resistance memory device according to some embodiments.
Figure 17A:
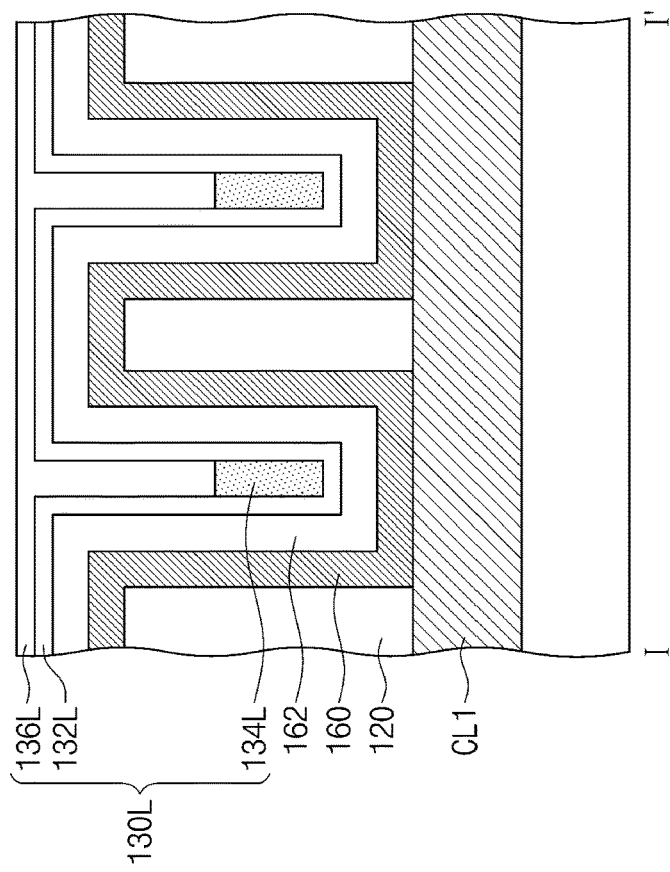

Referring to FIGS. 3 and 17A-17B, the lower electrode layer 160 may be formed on the mold layer 120 to conformally cover an inner surface of each of the first trenches T1, and the spacer layer 162 may be formed on the lower electrode layer 160 to conformally cover the inner surface of each of the first trenches T1. A filling insulating layer 130L may be formed on the spacer layer 162 to fill a remaining portion of each of the first trenches T1. The filling insulating layer 130L may include a first filling insulating layer 134L, a second filling insulating layer 132L, and a third filling insulating layer 136L. The second filling insulating layer 132L may be formed on the spacer layer 162 to conformally cover the inner surface of each of the first trenches T1. The first filling insulating layer 134L may be formed on the second filling insulating layer 132L, and may be formed locally in each of the first trenches T1. The third filling insulating layer 136L may be formed on the second filling insulating layer 132L, and may fill a remaining portion of each of the first trenches T1.

The first filling insulating layer 134L may include a different material from those of the second filling insulating layer 132L and the third filling insulating layer 136L. The first filling insulating layer 134L may include a material of which an etch resistance is greater than those of the second filling insulating layer 132L and the third filling insulating layer 136L. The second and third filling insulating layers 132L and 136L may be formed by, for example, a plasma enhanced ALD method, and may be deposited at a temperature of about 400 degrees Celsius or less. The second and third filling insulating layers 132L and 136L may be formed by substantially the same method as the second and third filling insulating layers 132L and 136L described with reference to FIGS. 7A-7B and 14. The first filling insulating layer 134L may be formed by, for example, a flowable chemical vapor deposition (flowable CVD) process, and may be deposited at a temperature of about 400 degrees Celsius or less. Since the first filling insulating layer 134L is formed by the flowable CVD process, the first filling insulating layer 134L may be deposited locally in each of the first trenches T1.

Figure 18A:
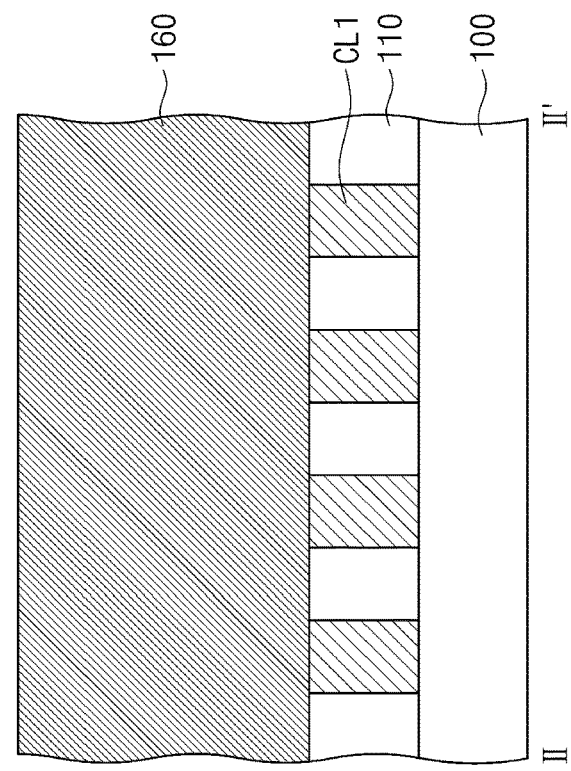
Figure 18B:
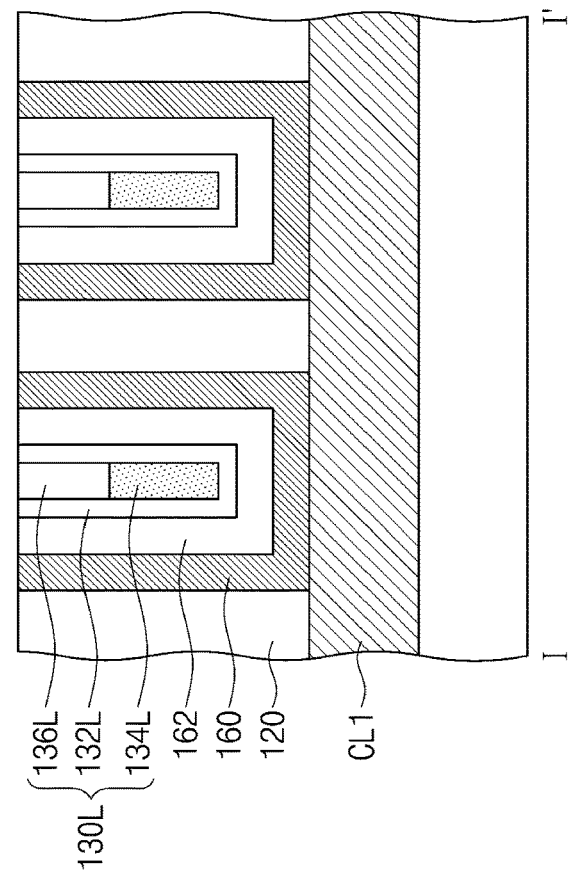

Referring to FIGS. 3 and 18A-18B, a planarization process may be performed on the filling insulating layer 130L. The planarization process may be performed until a top surface of the mold layer 120 is exposed. The third filling insulating layer 136L, the second filling insulating layer 132L, the spacer layer 162 and the lower electrode layer 160 may be sequentially planarized by the planarization process. The first filling insulating layer 134L and remaining portions of the third filling insulating layer 136L, the second filling insulating layer 132L, the spacer layer 162 and the lower electrode layer 160 may locally remain in each of the first trenches T1 after the planarization process.

Referring to FIGS. 3 and 19A-19B, the second trenches T2 may be formed in the mold layer 120 to intersect the first trenches T1. In some embodiments, as illustrated in FIGS. 16A to 16C, an upper portion of the lower interlayer insulating layer 110 between the pair of first conductive lines CL1 may be recessed when the second trenches T2 are formed. Thus, the lower interlayer insulating layer 110 may have a top surface 110Ur recessed toward the inside thereof.

The remaining portion of the lower electrode layer 160 may be divided into the lower electrodes EP1 by the second trenches T2, and the remaining portion of the spacer layer 162 may be divided into the spacers SR by the second trenches T2. The first filling insulating layer 134L may be divided into first filling insulating patterns 134 spaced apart from one another in the second direction D2 by the second trenches T2, and the remaining portion of the second filling insulating layer 132L may be divided into second filling insulating patterns 132 spaced apart from one another in the second direction D2 by the second trenches T2. The remaining portion of the third filling insulating layer 136L may be divided into third filling insulating patterns 136 spaced apart from one another in the second direction D2 by the second trenches T2. Each of the first filling insulating patterns 134, each of the second filling insulating patterns 132 and each of the third filling insulating patterns 136 may constitute a filling insulating structure 130.

An insulating layer 140L may be formed on the mold layer 120 to fill each of the second trenches T2. The insulating layer 140L may include a first insulating layer 144L, a second insulating layer 142L, and a third insulating layer 146L. The second insulating layer 142L may be formed to cover an inner surface of each of the second trenches T2 with a substantially uniform thickness. The first insulating layer 144L may be formed on the second insulating layer 142L, and may be formed locally in each of the second trenches T2. The third insulating layer 146L may be formed on the second insulating layer 142L, and may fill a remaining portion of each of the second trenches T2.

The first insulating layer 144L may include a different material from those of the second insulating layer 142L and the third insulating layer 146L. The first insulating layer 144L may include a material of which an etch resistance is greater than those of the second insulating layer 142L and the third insulating layer 146L. The second and third insulating layers 142L and 146L may be formed by, for example, a plasma enhanced ALD method, and may be deposited at a temperature of about 400 degrees Celsius or less. The second and third insulating layers 142L and 146L may be formed by substantially the same method as the second and third insulating layers 142L and 146L described with reference to FIGS. 10A-10B and 14. The first insulating layer 144L may be formed by, for example, a flowable CVD process and may be deposited at a temperature of about 400 degrees Celsius or less. Since the first insulating layer 144L is formed by the flowable CVD process, the first insulating layer 144L may be deposited locally in each of the second trenches T2.

Figure 20B:
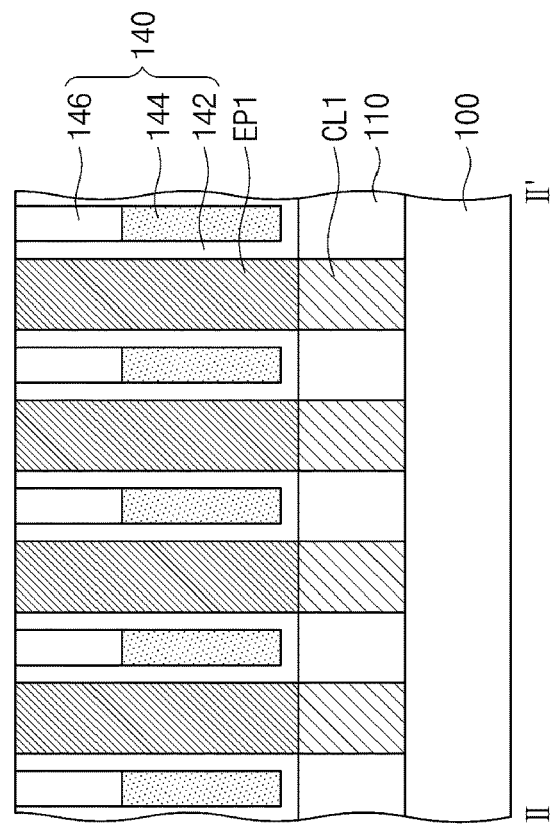
Figure 20A:
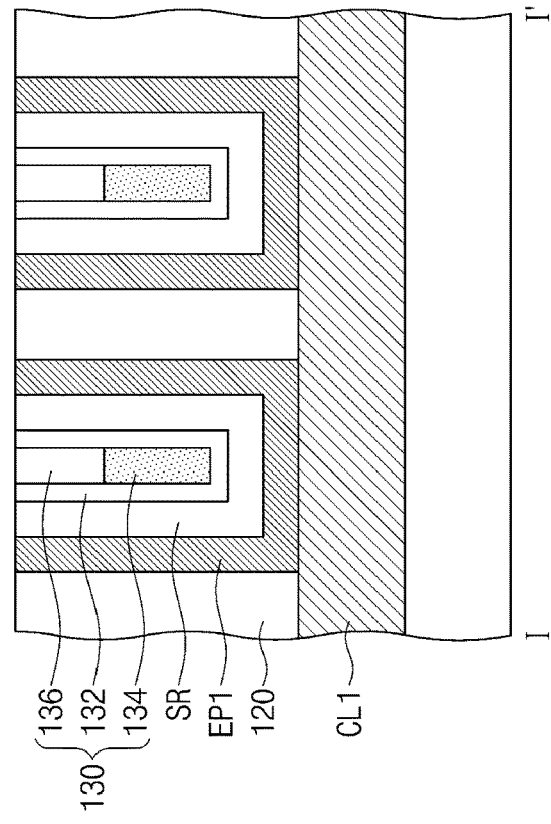

Referring to FIGS. 3 and 20A-20B, a planarization process may be performed on the insulating layer 140L. The planarization process may be performed until a top surface of the mold layer 120 is exposed. The third insulating layer 146L and the second insulating layer 142L may be sequentially planarized by the planarization process. The first insulating layer 144L and remaining portions of the second and third insulating layers 142L and 146L may remain locally in each of the second trenches T2 after the planarization process. Insulating structures 140 may be respectively formed in the second trenches T2 by the planarization process. Each of the insulating structures 140 may include a first insulating pattern 144, a second insulating pattern 142, and a third insulating pattern 146, which are disposed in each of the second trenches T2. The first insulating pattern 144 may correspond to the first insulating layer 144L deposited locally in each of the second trenches T2. The second insulating pattern 142 may correspond to the remaining portion of the second insulating layer 142L which remains in each of the second trenches T2, and the third insulating pattern 146 may correspond to the remaining portion of the third insulating layer 146L which remains in each of the second trenches T2.

Figure 21A:
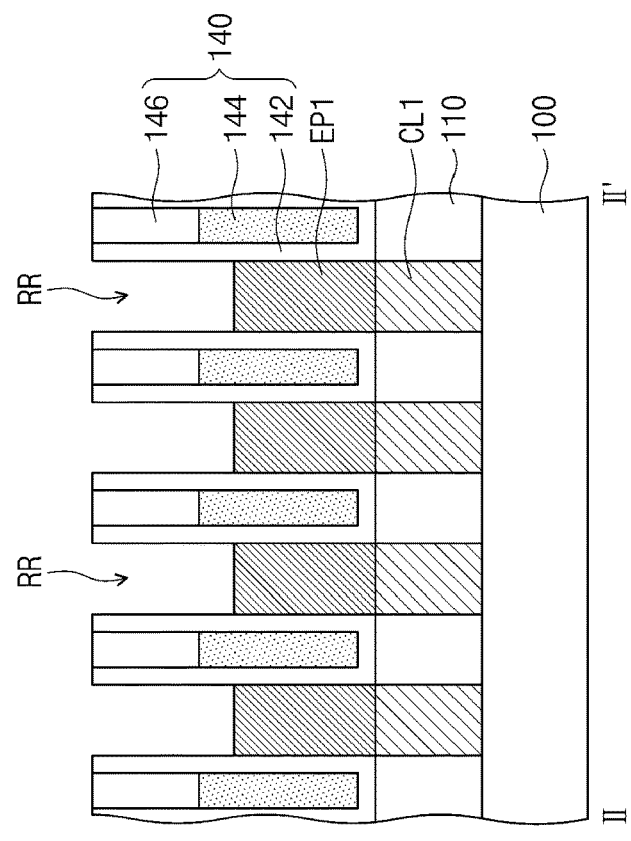
Figure 21B:
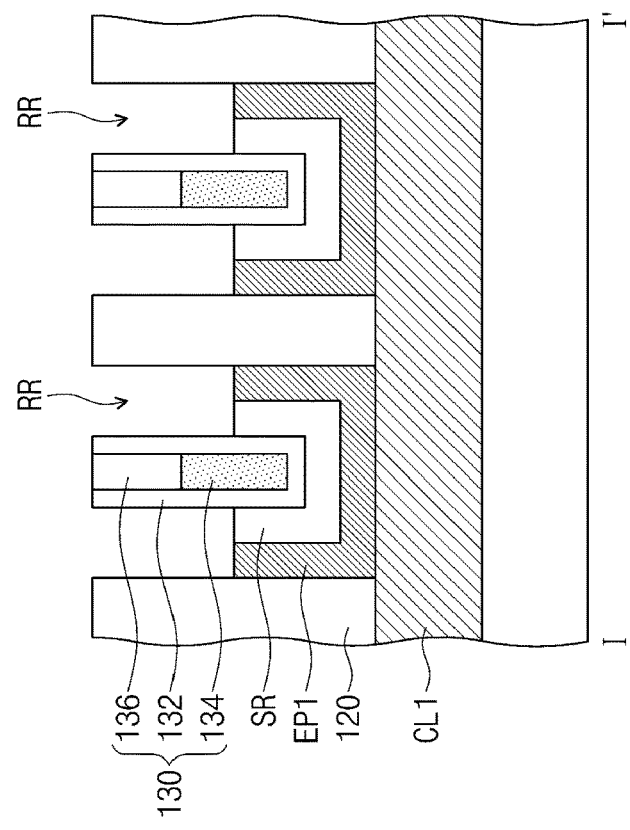

Referring to FIGS. 3 and 21A-21B, the recess regions RR may be formed in the mold layer 120. An etch resistance of the first filling insulating pattern 134 with respect to the wet etching process for forming the recess regions RR may be greater than those of the second and third filling insulating patterns 132 and 136 with respect to the wet etching process. In addition, an etch resistance of the first insulating pattern 144 with respect to the wet etching process may be greater than those of the second and third insulating patterns 142 and 146 with respect to the wet etching process. Thus, a loss of the filling insulating structure 130 and the insulating structures 140 may be reduced or minimized during the wet etching process. Subsequent processes may be substantially the same as corresponding processes described with reference to FIGS. 6A-6B to 14.

Figure 22A:
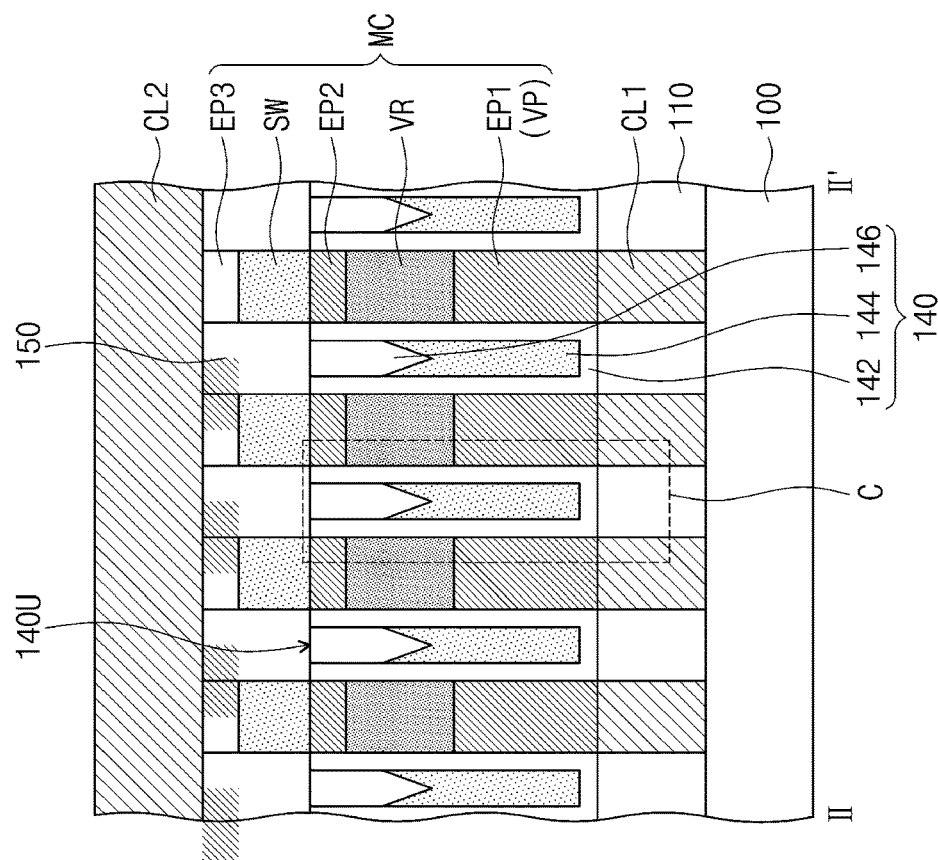
FIGS. 22A-22B are cross-sectional views taken along the lines I-I' and II-II' of FIG. 3, respectively, to illustrate a variable resistance memory device according to some embodiments.
Figure 22B:
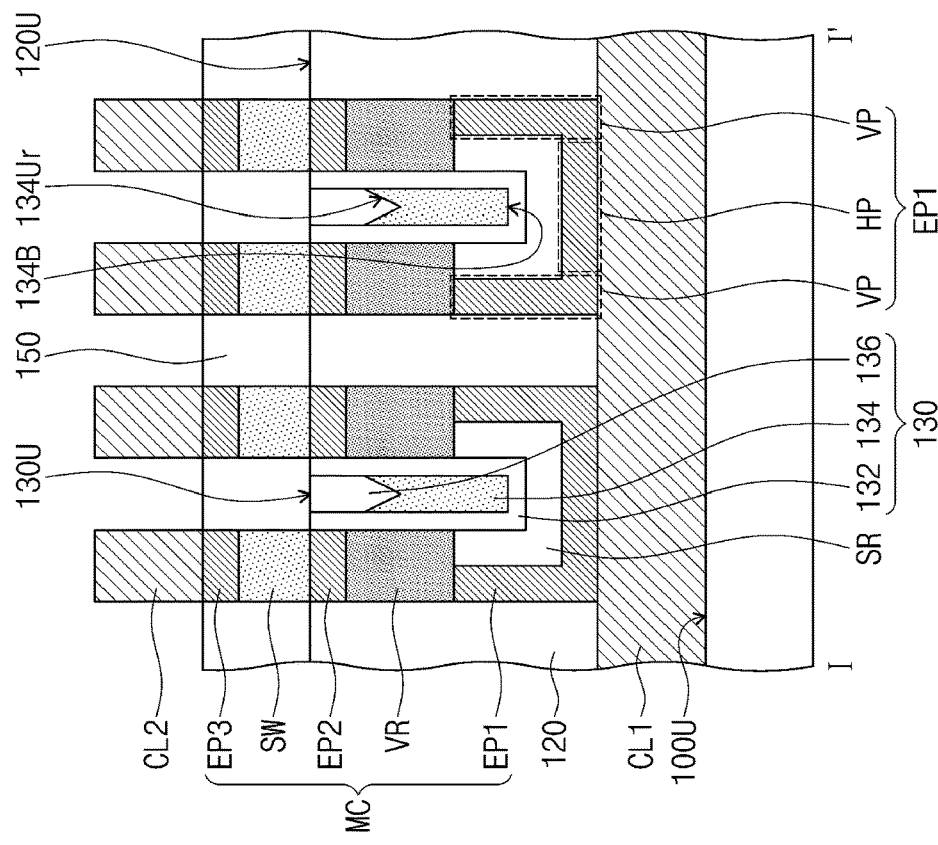
Figure 23A:
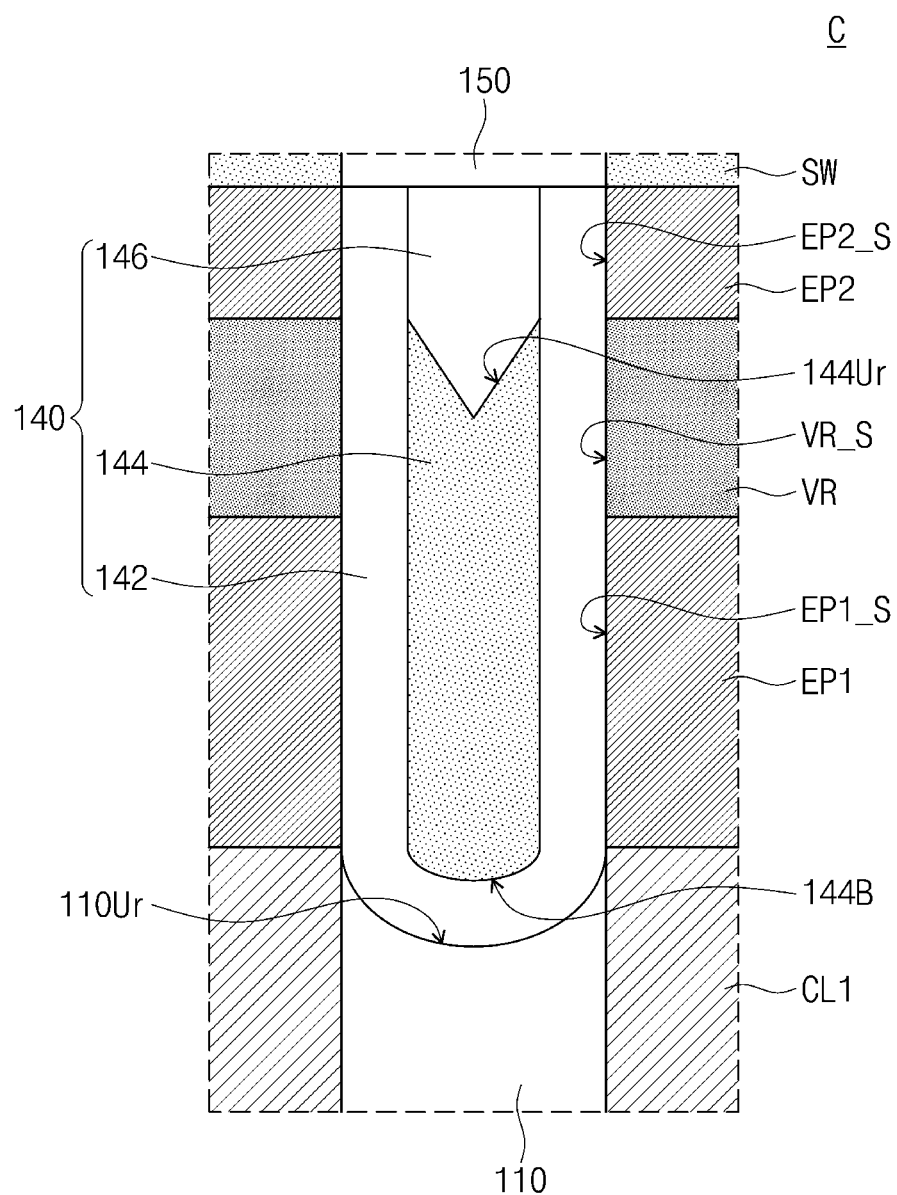
FIG. 23A is an enlarged view of a portion 'C' of FIG. 22B.

FIGS. 22A-22B are cross-sectional views taken along the lines I-I' and II-II' of FIG. 3, respectively, to illustrate a variable resistance memory device according to some embodiments. FIG. 23A is an enlarged view of a portion 'C' of FIG. 22B. Hereinafter, differences between the present embodiments and the above embodiments described with reference to FIGS. 1 to 5 will be mainly mentioned for the purpose of ease and convenience in explanation.

Referring to FIGS. 3, 22A-22B and 23A, the filling insulating structure 130 may include the first filling insulating pattern 134 between the pair of memory cells MC adjacent to each other in the first direction D1, the second filling insulating pattern 132 disposed between the first filling insulating pattern 134 and each of the pair of memory cells MC, and a third filling insulating pattern 136 on the first filling insulating pattern 134. The third filling insulating pattern 136 may be disposed between the pair of memory cells MC, and the second filling insulating pattern 132 may extend between the third filling insulating pattern 136 and each of the pair of memory cells MC. According to the present embodiments, the first filling insulating pattern 134 may have a top surface 134Ur recessed toward the inside thereof. The recessed top surface 134Ur of the first filling insulating pattern 134 may be tapered toward the substrate 100. The third filling insulating pattern 136 may cover and be in contact with the recessed top surface 134Ur of the first filling insulating pattern 134. The first filling insulating pattern 134 may have a bottom surface 134B opposite to the recessed top surface 134Ur. The second filling insulating pattern 132 may extend along the bottom surface 134B of the first filling insulating pattern 134. Except for these differences, the other features of the filling insulating structure 130 may be substantially the same as corresponding features of the filling insulating structure 130 described with reference to FIGS. 15A-15B and 16A.

Referring to FIGS. 22B and 23A, each of the insulating structures 140 may include the first insulating pattern 144 between the pair of memory cells MC adjacent to each other in the second direction D2, the second insulating pattern 142 disposed between the first insulating pattern 144 and each of the pair of memory cells MC, and a third insulating pattern 146 on the first insulating pattern 144. The third insulating pattern 146 may be disposed between the pair of memory cells MC, and the second insulating pattern 142 may extend between the third insulating pattern 146 and each of the pair of memory cells MC. The second insulating pattern 142 may extend between the first insulating pattern 144 and the lower interlayer insulating layer 110. According to the present embodiments, the first insulating pattern 144 may have a top surface 144Ur recessed toward the inside thereof. The recessed top surface 144Ur of the first insulating pattern 144 may be tapered toward the substrate 100. The third insulating pattern 146 may cover and be in contact with the recessed top surface 144Ur of the first insulating pattern 144. The first insulating pattern 144 may have a bottom surface 144B opposite to the recessed top surface 144Ur. The second insulating pattern 142 may extend along the bottom surface 144B of the first insulating pattern 144. Except for these differences, the other features of the insulating structures 140 may be substantially the same as corresponding features of the insulating structures 140 described with reference to FIGS. 15A-15B and 16A.

Figure 23B:
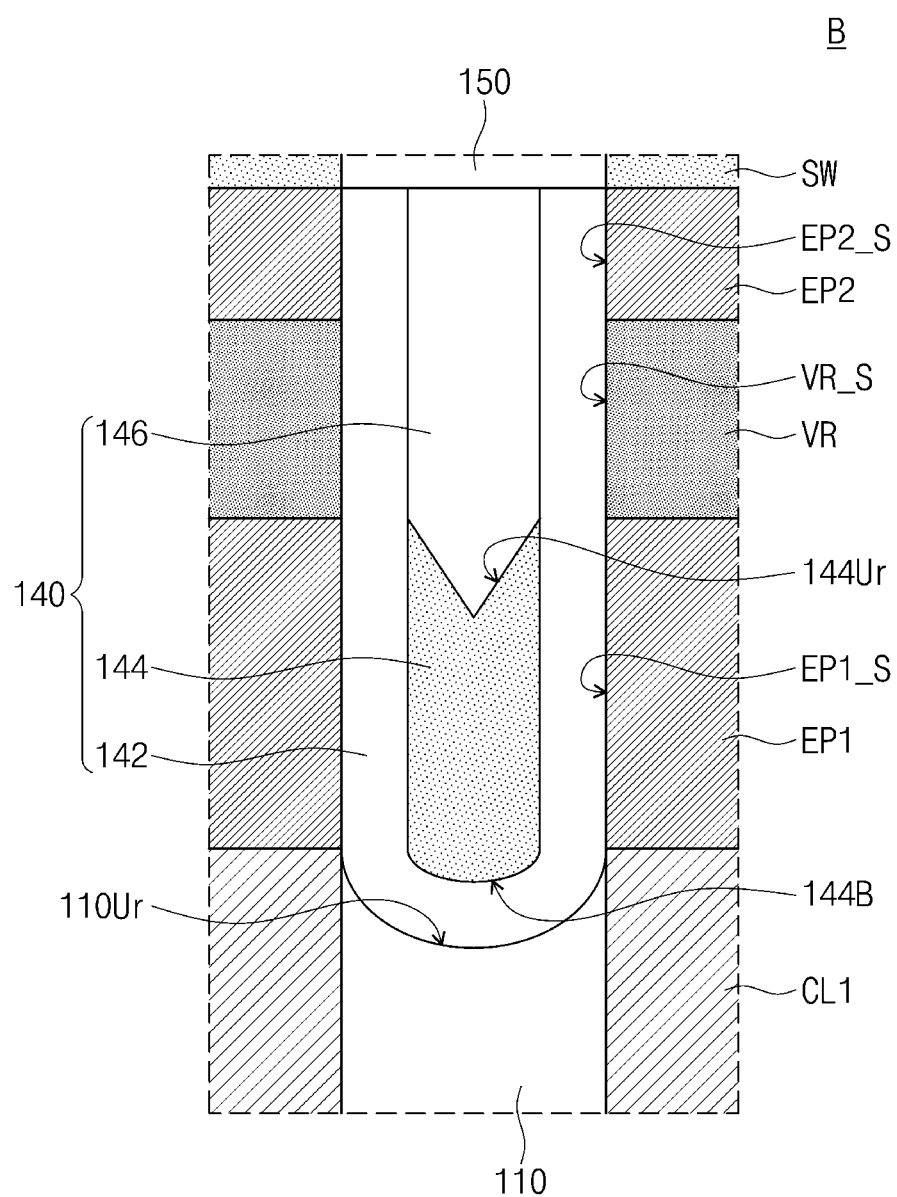
FIG. 23B is an enlarged view corresponding to the portion 'C' of FIG. 22B to illustrate a modified example of a variable resistance memory device according to some embodiments.

FIG. 23B is an enlarged view corresponding to the portion 'C' of FIG. 22B to illustrate a modified example of a variable resistance memory device according to some embodiments.

Referring to FIG. 23B, according to a modified example, the first insulating pattern 144 may be disposed between the lower electrodes EP1 adjacent to each other. The third insulating pattern 146 may be disposed between the connection electrodes EP2 adjacent to each other, and between the variable resistance patterns VR adjacent to each other, and may extend between the lower electrodes EP1 so as to be in contact with the recessed top surface 144Ur of the first insulating pattern 144. Except for these differences, the other features of the insulating structures 140 according to the present modified example may be substantially the same as corresponding features of the insulating structures 140 described with reference to FIG. 16B.

FIGS. 24A-24B to 30A-30B are cross-sectional views corresponding to the lines I-I' and II-II' of FIG. 3, respectively, to illustrate a method of manufacturing a variable resistance memory device according to some embodiments. Hereinafter, differences between the present embodiments and the above embodiments described with reference to FIGS. 6A-6B to 14 will be mainly mentioned for the purpose of ease and convenience in explanation.

Figure 24B:
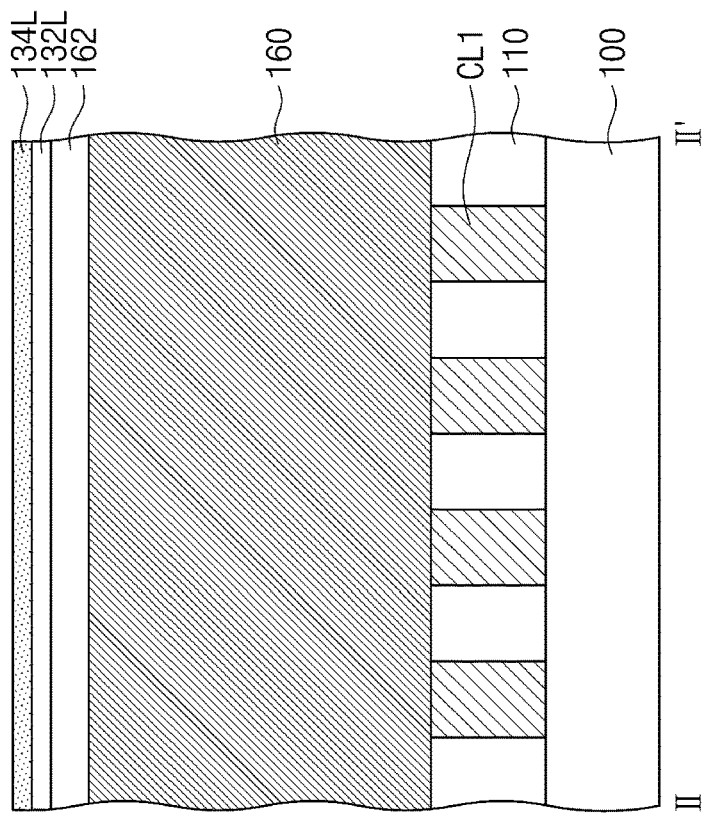
FIGS. 24A-24B to 30A-30B are cross-sectional views corresponding to the lines I-I' and II-II' of FIG. 3, respectively, to illustrate a method of manufacturing a variable resistance memory device according to some embodiments.
Figure 24A:
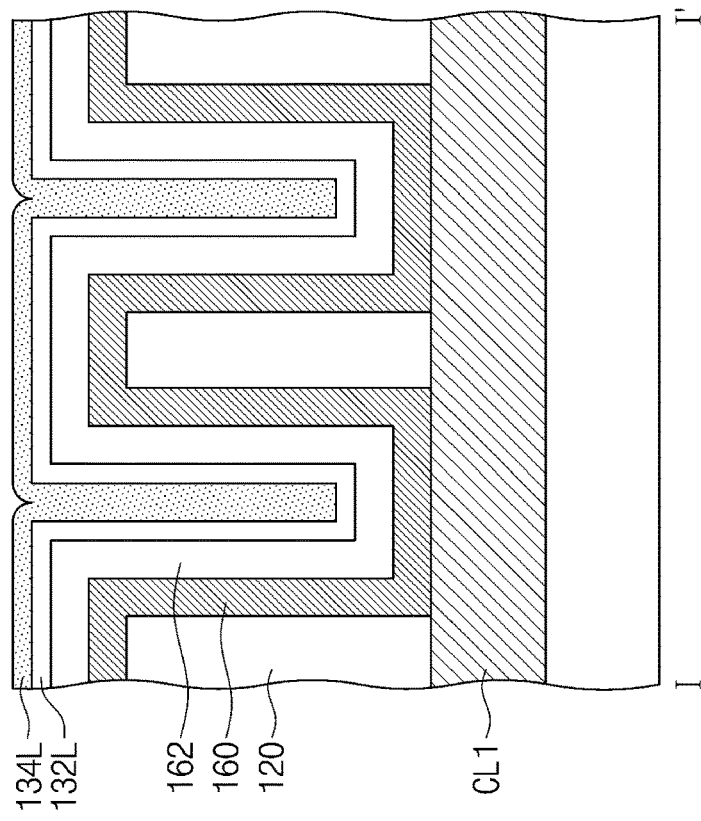

Referring to FIGS. 3 and 24A-24B, the lower electrode layer 160 may be formed on the mold layer 120 to conformally cover an inner surface of each of the first trenches T1, and the spacer layer 162 may be formed on the lower electrode layer 160 to conformally cover the inner surface of each of the first trenches T1. The second filling insulating layer 132L may be formed on the spacer layer 162 to conformally cover the inner surface of each of the first trenches T1, and the first filling insulating layer 134L may be formed on the second filling insulating layer 132L to fill a remaining portion of each of the first trenches T1. The second filling insulating layer 132L may be formed by, for example, a plasma enhanced ALD method, and may be deposited at a temperature of about 400 degrees Celsius or less. The second filling insulating layer 132L may be formed by substantially the same method as the second filling insulating layer 132L described with reference to FIGS. 7A-7B and 14. The first filling insulating layer 134L may be formed by, for example, an ALD process, and may be deposited at a temperature of about 400 degrees Celsius or less.

Figure 25B:
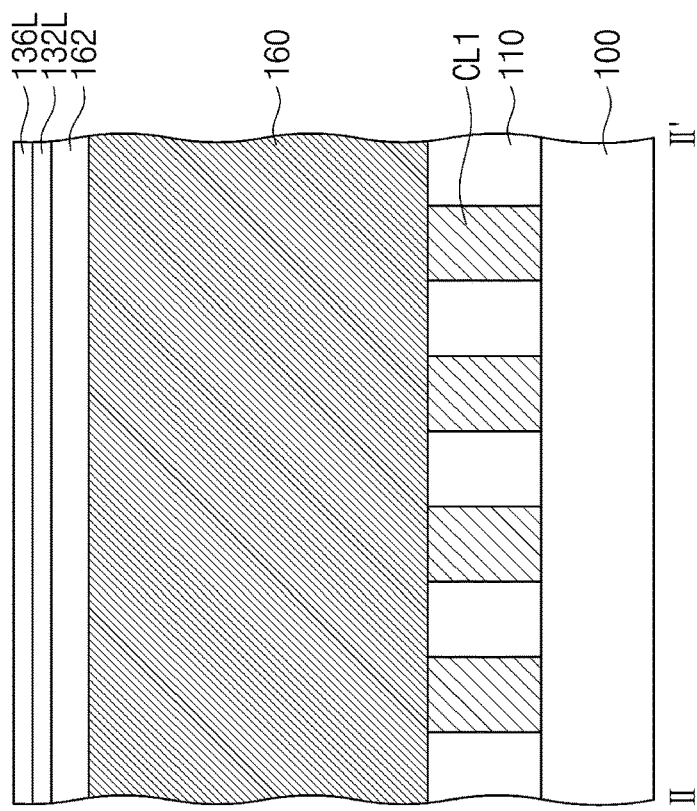
Figure 25A:
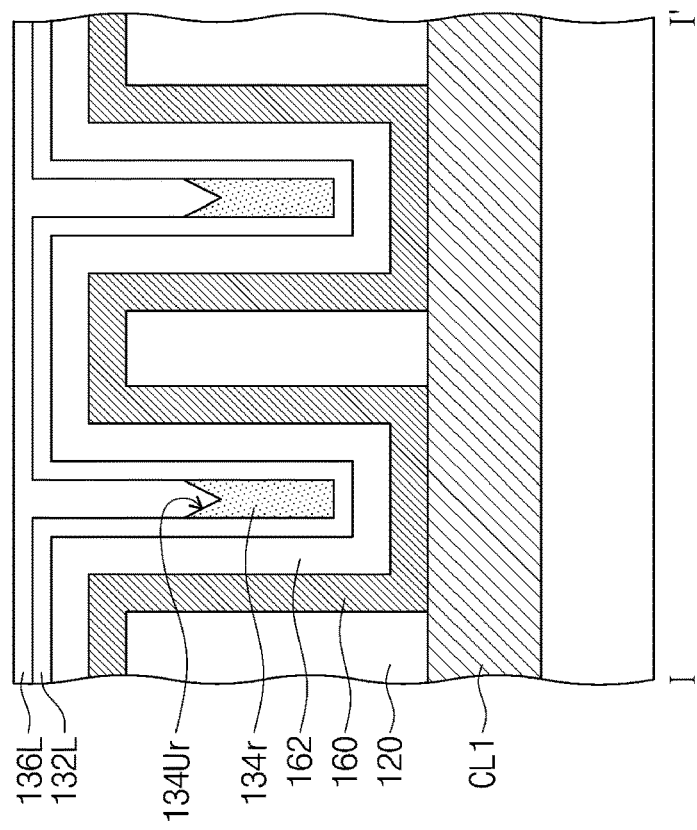

Referring to FIGS. 3 and 25A-25B, a portion of the first filling insulating layer 134L may be selectively etched to form a preliminary filling insulating pattern 134r in each of the first trenches T1. The preliminary filling insulating pattern 134r may be formed locally in each of the first trenches T1, and may extend in the second direction D2. By the selective etching, the preliminary filling insulating pattern 134r may have a top surface 134Ur recessed toward the inside thereof. A portion of the second filling insulating layer 132L may be exposed by the selective etching. Thereafter, the third filling insulating layer 136L may be formed on the second filling insulating layer 132L to fill a remaining portion of each of the first trenches T1. For example, the third filling insulating layer 136L may be formed by a plasma enhanced ALD method, and may be deposited at a temperature of about 400 degrees Celsius or less. The third filling insulating layer 136L may be formed by substantially the same method as the third filling insulating layer 136L described with reference to FIGS. 7A-7B and 14.

Figure 26B:
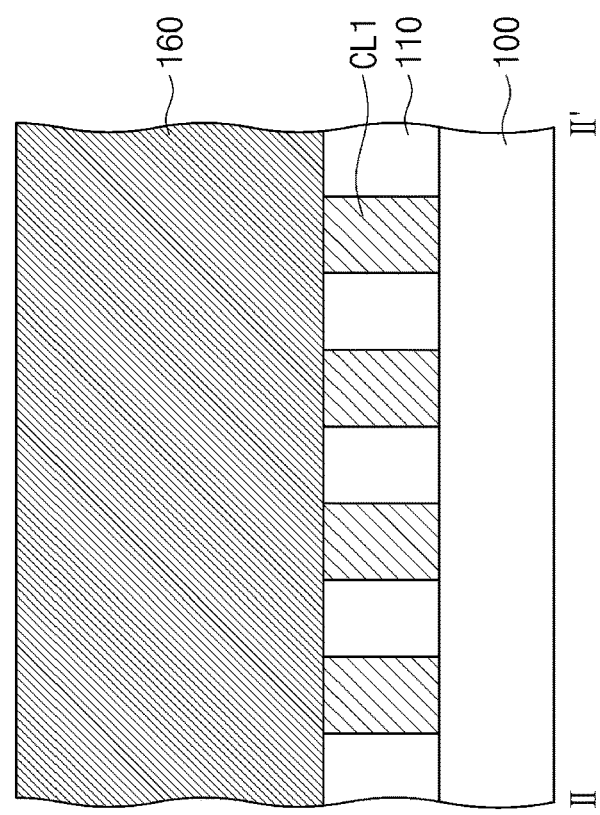
Figure 26A:
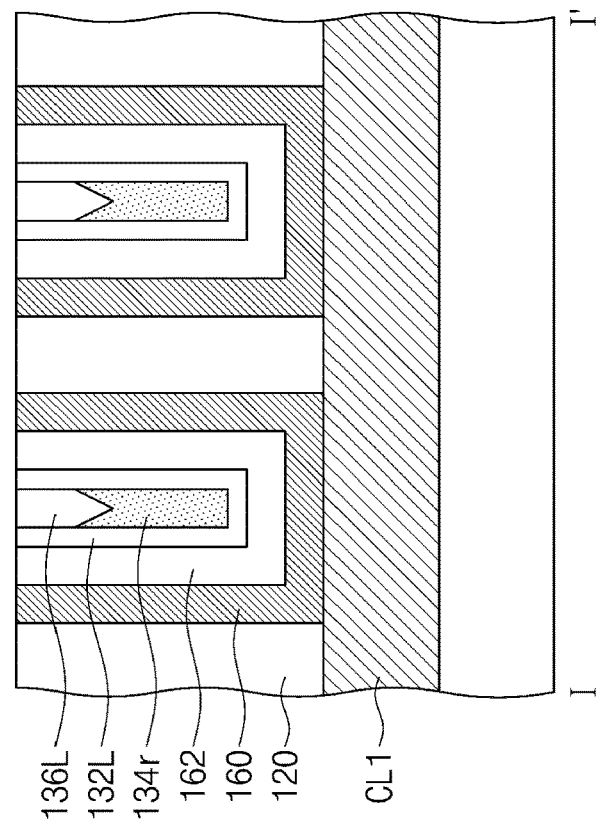

Referring to FIGS. 3 and 26A-26B, a planarization process may be performed on the third filling insulating layer 136L. The planarization process may be performed until a top surface of the mold layer 120 is exposed. The third filling insulating layer 136L, the second filling insulating layer 132L, the spacer layer 162 and the lower electrode layer 160 may be sequentially planarized by the planarization process. The preliminary filling insulating pattern 134r and remaining portions of the third filling insulating layer 136L, the second filling insulating layer 132L, the spacer layer 162 and the lower electrode layer 160 may locally remain in each of the first trenches T1 after the planarization process.

Figure 27A:
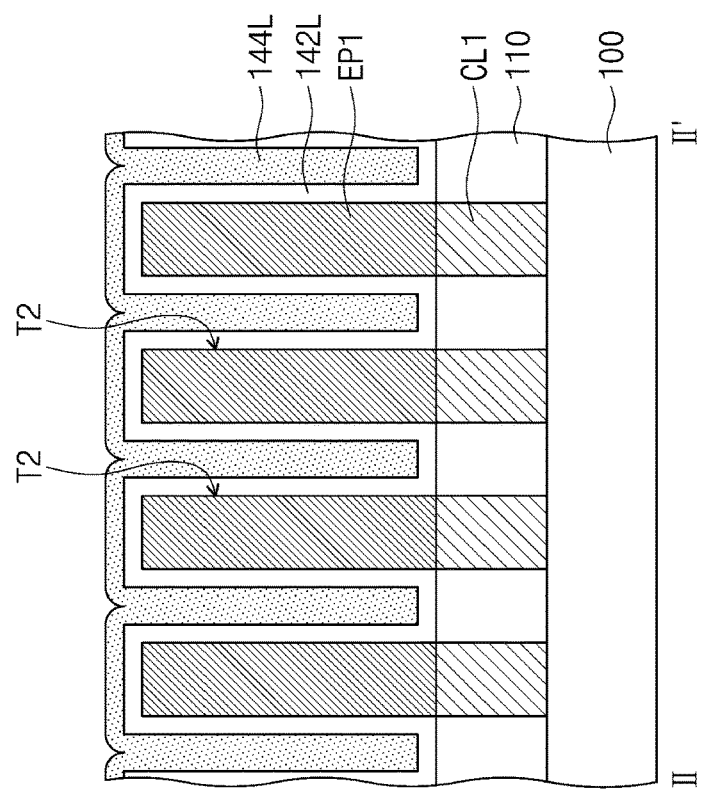
Figure 27B:
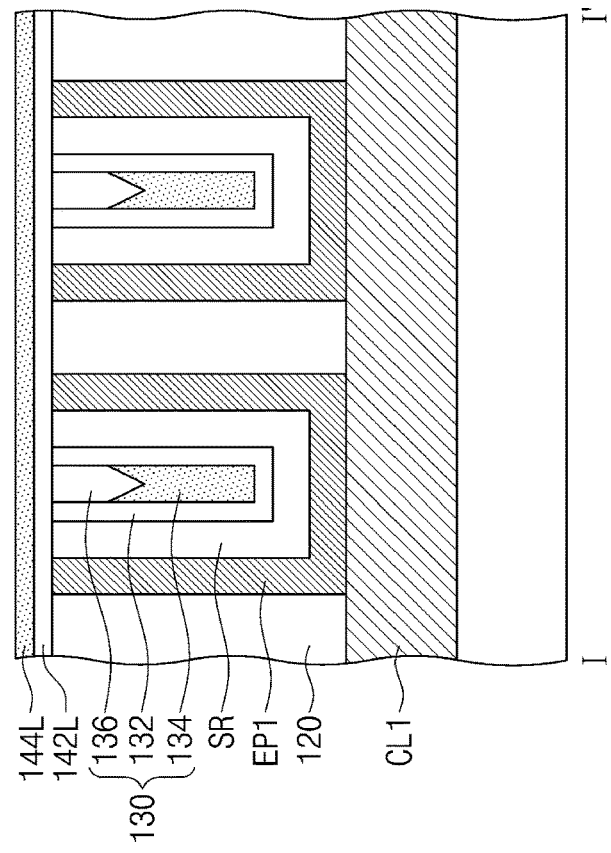

Referring to FIGS. 3 and 27A-27B, the second trenches T2 may be formed in the mold layer 120 to intersect the first trenches T1. In some embodiments, as illustrated in FIGS. 23A and 23B, an upper portion of the lower interlayer insulating layer 110 between the pair of first conductive lines CL1 may be recessed when the second trenches T2 are formed. Thus, the lower interlayer insulating layer 110 may have a top surface 110Ur recessed toward the inside thereof.

The remaining portion of the lower electrode layer 160 may be divided into the lower electrodes EP1 by the second trenches T2, and the remaining portion of the spacer layer 162 may be divided into the spacers SR by the second trenches T2. The preliminary filling insulating pattern 134r may be divided into first filling insulating patterns 134 spaced apart from one another in the second direction D2 by the second trenches T2, and the remaining portion of the second filling insulating layer 132L may be divided into second filling insulating patterns 132 spaced apart from one another in the second direction D2 by the second trenches T2. The remaining portion of the third filling insulating layer 136L may be divided into third filling insulating patterns 136 spaced apart from one another in the second direction D2 by the second trenches T2. Each of the first filling insulating patterns 134, each of the second filling insulating patterns 132 and each of the third filling insulating patterns 136 may constitute a filling insulating structure 130.

The second insulating layer 142L may be formed to conformally cover an inner surface of each of the second trenches T2, and the first insulating layer 144L may be formed on the second insulating layer 142L to fill a remaining portion of each of the second trenches T2. The second insulating layer 142L may be formed by, for example, a plasma enhanced ALD method and may be deposited at a temperature of about 400 degrees Celsius or less. The second insulating layer 142L may be formed by substantially the same method as the second insulating layer 142L described with reference to FIGS. 10A-10B and 14. The first insulating layer 144L may be formed by, for example, an ALD process and may be deposited at a temperature of about 400 degrees Celsius or less.

Figure 28A:
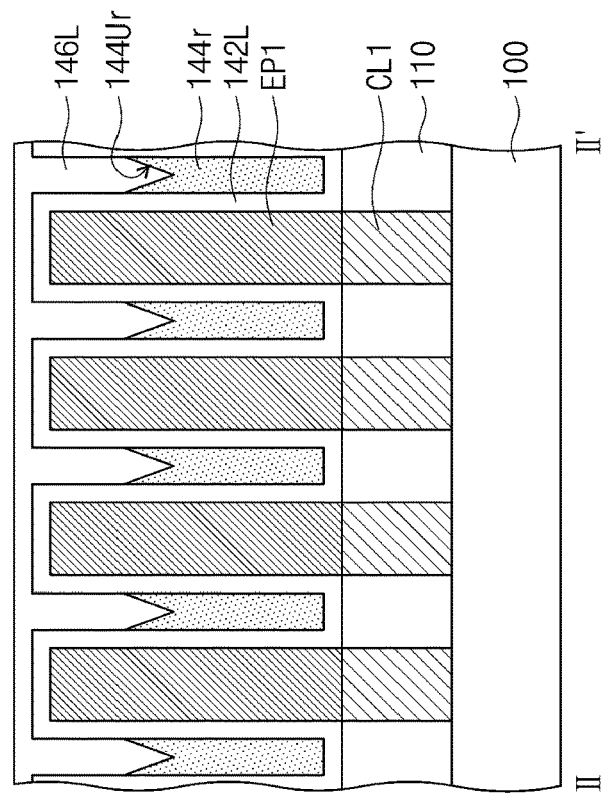
Figure 28B:
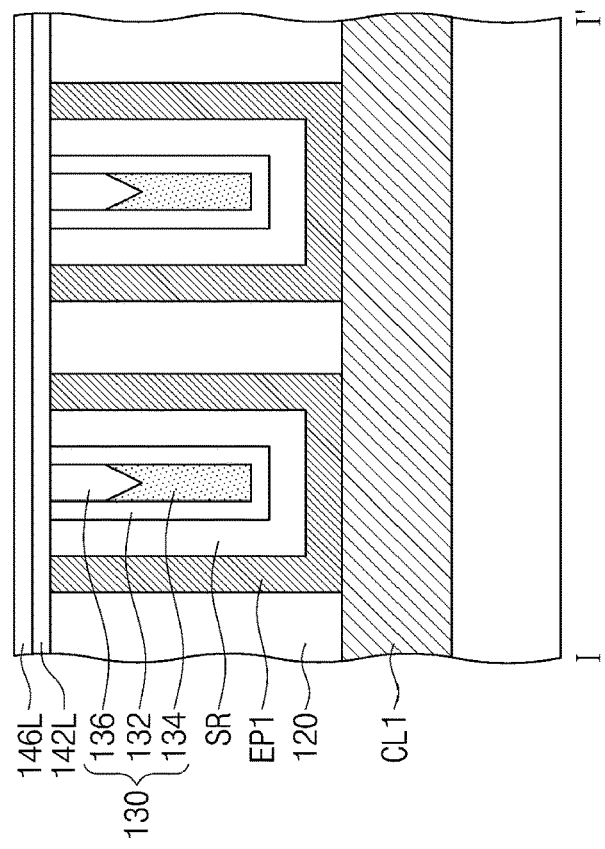

Referring to FIGS. 3 and 28A-28B, a portion of the first insulating layer 144L may be selectively etched to form a preliminary insulating pattern 144r in each of the second trenches T2. The preliminary insulating pattern 144r may be formed locally in each of the second trenches T2, and may extend in the first direction D1. By the selective etching, the preliminary insulating pattern 144r may have a top surface 144Ur recessed toward the inside thereof. A portion of the second insulating layer 142L may be exposed by the selective etching. Thereafter, the third insulating layer 146L may be formed on the second insulating layer 142L to fill a remaining portion of each of the second trenches T2. For example, the third insulating layer 146L may be formed by a plasma enhanced ALD method, and may be deposited at a temperature of about 400 degrees Celsius or less. The third insulating layer 146L may be formed by substantially the same method as the third insulating layer 146L described with reference to FIGS. 10A-10B and 14.

Figure 29A:
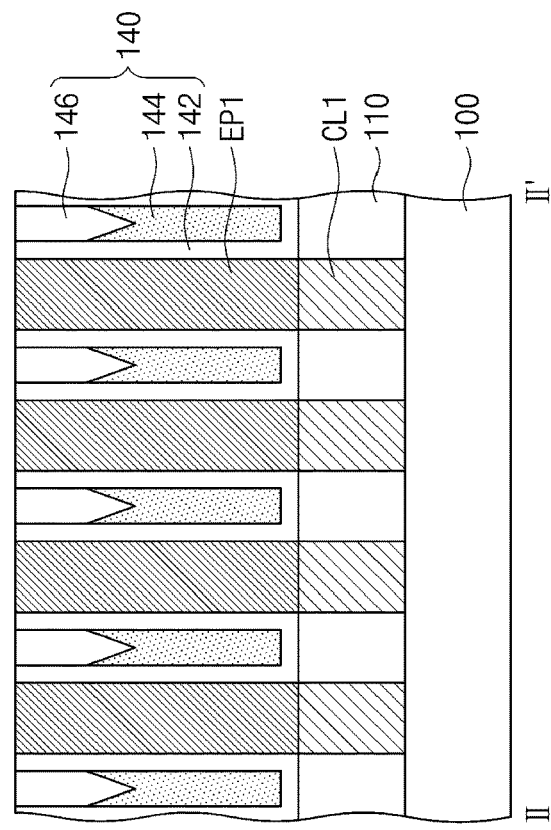
Figure 29B:
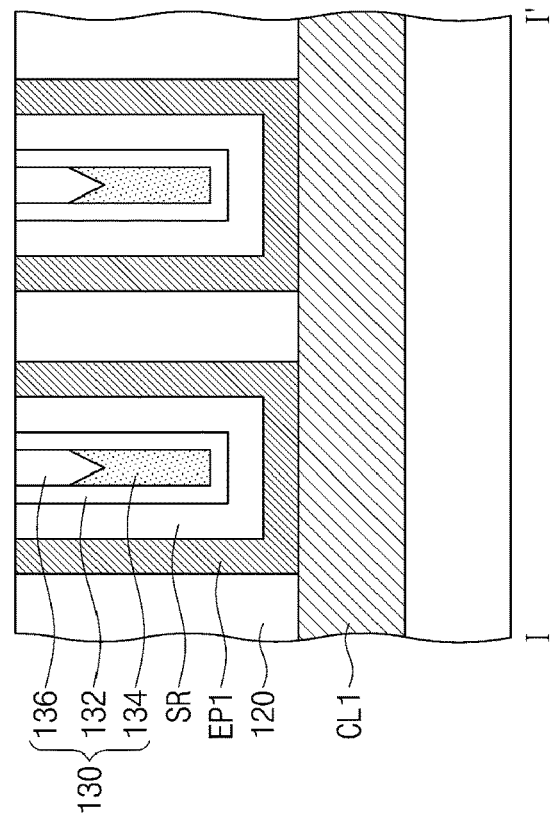

Referring to FIGS. 3 and 29A-29B, a planarization process may be performed on the third insulating layer 146L. The planarization process may be performed until a top surface of the mold layer 120 is exposed. The third insulating layer 146L and the second insulating layer 142L may be sequentially planarized by the planarization process. The preliminary insulating pattern 144r and remaining portions of the second and third insulating layers 142L and 146L may remain locally in each of the second trenches T2 after the planarization process. Insulating structures 140 may be respectively formed in the second trenches T2 by the planarization process. Each of the insulating structures 140 may include a first insulating pattern 144, a second insulating pattern 142, and a third insulating pattern 146, which are disposed in each of the second trenches T2. The first insulating pattern 144 may correspond to the preliminary insulating pattern 144r. The second insulating pattern 142 may correspond to the remaining portion of the second insulating layer 142L which remains in each of the second trenches T2, and the third insulating pattern 146 may correspond to the remaining portion of the third insulating layer 146L which remains in each of the second trenches T2. According to the present embodiments, each of the first filling insulating pattern 134 and the first insulating pattern 144 may be easily formed by the selective etching, and thus, the first filling insulating pattern 134 and the first insulating pattern 144 may have the recessed top surface 134Ur and the recessed top surface 144Ur, respectively.

Figure 30A:
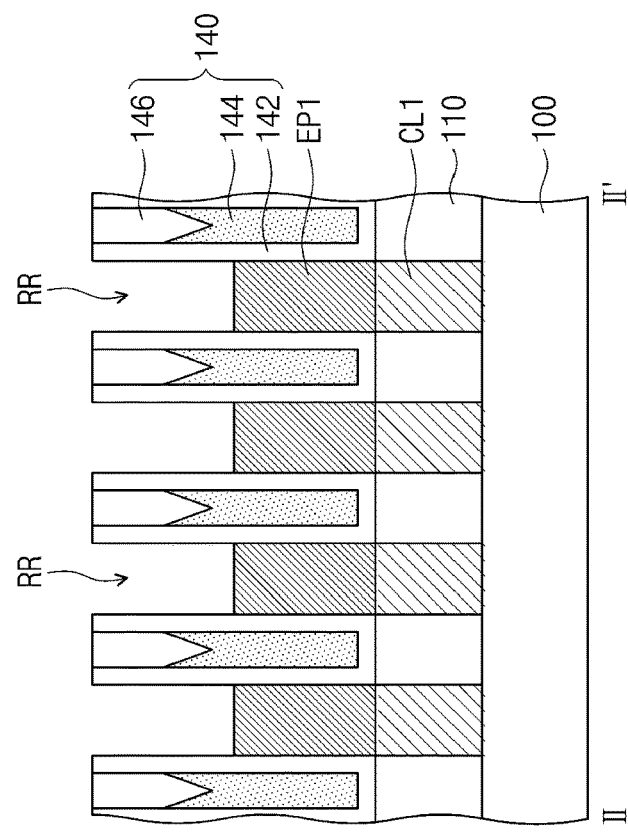
Figure 30B:
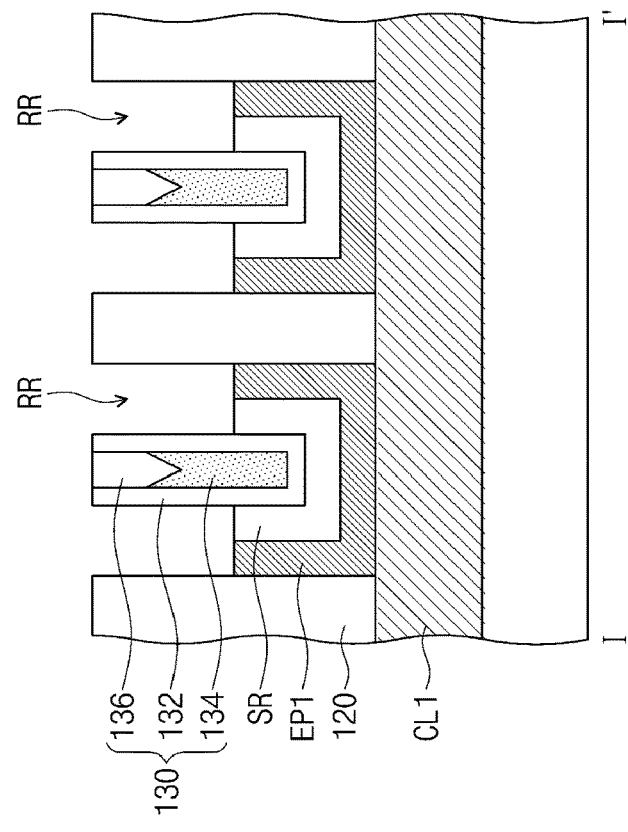

Referring to FIGS. 3 and 30A-30B, the recess regions RR may be formed in the mold layer 120. An etch resistance of the first filling insulating pattern 134 with respect to the wet etching process for forming the recess regions RR may be greater than those of the second and third filling insulating patterns 132 and 136 with respect to the wet etching process. In addition, an etch resistance of the first insulating pattern 144 with respect to the wet etching process may be greater than those of the second and third insulating patterns 142 and 146 with respect to the wet etching process. Thus, a loss of the filling insulating structure 130 and the insulating structures 140 may be reduced or minimized during the wet etching process. Subsequent processes may be substantially the same as corresponding processes described with reference to FIGS. 6A-6B to 14.

The embodiments may provide the variable resistance memory device which has the improved electrical characteristics and of which defects are minimized, and the method of manufacturing the same.

While the inventive concepts have been described with reference to example embodiments, it will be apparent to those skilled in the art that various changes and modifications may be made without departing from the spirits and scopes. Therefore, it should be understood that the above embodiments are not limiting, but illustrative. Thus, the scopes are to be determined by the broadest permissible interpretation of the following claims and their equivalents, and shall not be restricted or limited by the foregoing description.

What is claimed is:

1. A variable resistance memory device comprising:
   first conductive lines spaced apart from each other on a substrate;
   a lower interlayer insulating layer interposed between the first conductive lines, the lower interlayer insulating layer covering side surfaces of the first conductive lines;
   memory cells disposed on the first conductive lines, respectively, each of the memory cells comprising a variable resistance pattern and a switching pattern vertically stacked on the substrate; and
   an insulating structure interposed between the memory cells and disposed on the lower interlayer insulating later, wherein the insulating structure comprises:
      a first insulating pattern interposed between the memory cells, wherein the first insulating pattern comprises any one or any combination of carbon-containing silicon nitride and carbon-containing silicon oxide; and
      a second insulating pattern disposed on a sidewall of the variable resistance pattern of each of the memory cells, wherein the second insulating pattern is interposed between the first insulating pattern and the variable resistance pattern of each of the memory cells, the second insulating pattern extends between the first insulating pattern and the lower interlayer insulating layer, and the second insulating pattern comprises a material different from a material of the first insulating pattern,
   wherein the lower interlayer insulating layer has a top surface recessed toward an inside of the lower interlayer insulating layer, and
   wherein the second insulating pattern extends along the recessed top surface of the lower interlayer insulating layer and a bottom surface of the first insulating pattern.

2. The variable resistance memory device of claim 1, wherein the material of the first insulating pattern has an etch resistance greater than the etch resistance of the material of the second insulating pattern.

3. The variable resistance memory device of claim 1, wherein the insulating structure further comprises a third insulating pattern disposed on the first insulating pattern,
   wherein the third insulating pattern is interposed between the memory cells, and
   wherein the second insulating pattern extends between the third insulating pattern and each of the memory cells.

4. The variable resistance memory device of claim 3, wherein the material of the first insulating pattern is different from a material of the third insulating pattern.

5. The variable resistance memory device of claim 3, wherein the third insulating pattern comprises a material that is the same as the material of the second insulating pattern.

6. The variable resistance memory device of claim 3, wherein the first insulating pattern has a top surface recessed toward an inside of the top surface, and a bottom surface opposite to the recessed top surface,
   wherein the third insulating pattern covers the recessed top surface of the first insulating pattern, and
   wherein the second insulating pattern extends along the bottom surface of the first insulating pattern.

7. The variable resistance memory device of claim 1, wherein each of the memory cells further comprises:
   a lower electrode connected to the variable resistance pattern;
   a connection electrode interposed between the variable resistance pattern and the switching pattern; and
   an upper electrode connected to the switching pattern.

8. The variable resistance memory device of claim 1, wherein the first insulating pattern and the second insulating pattern are formed using a plasma enhance atomic layer deposition method at a temperature of about 400 degrees Celsius or less, and
   wherein a thickness of the first insulating pattern is less than a thickness of the second insulating pattern.

9. The variable resistance memory device of claim 1, wherein the first insulating pattern includes a void therein.

10. A variable resistance memory device comprising:
    first conductive lines spaced apart from each other on a substrate;
    a lower interlayer insulating layer interposed between the first conductive lines;
    memory cells disposed on the first conductive lines, respectively, wherein each of the memory cells comprises a variable resistance pattern and a switching pattern vertically stacked on each of the first conductive lines;
    a second conductive line intersecting the first conductive lines and connected to the memory cells; and
    an insulating structure interposed between the memory cells and disposed on the lower interlayer insulating layer, wherein the insulating structure comprises:
       a first insulating pattern interposed between the memory cells; and
       a second insulating pattern disposed on a sidewall of the variable resistance pattern of each of the memory cells, wherein the second insulating pattern is interposed between the first insulating pattern and the variable resistance pattern of each of the memory cells, the second insulating pattern extends between the first insulating pattern and the lower interlayer insulating layer, and the second insulating pattern comprises a material different from a material of the first insulating pattern, wherein the lower interlayer insulating layer has a top surface recessed toward an inside of the lower interlayer insulating layer, and side surfaces being in contact with side surfaces of the first conductive lines, and wherein the second insulating pattern extends along the recessed top surface of the lower interlayer insulating layer and a bottom surface of the first insulating pattern.

11. The variable resistance memory device of claim 10, wherein the insulating structure further comprises a third insulating pattern disposed on the first insulating pattern, wherein the third insulating pattern is interposed between the memory cells, and wherein the second insulating pattern extends between the third insulating pattern and each of the memory cells.

12. The variable resistance memory device of claim 11, wherein the material of the first insulating pattern is different from a material of the third insulating pattern.

13. The variable resistance memory device of claim 11, wherein the third insulating pattern comprises a material that is the same as the material of the second insulating pattern.

14. The variable resistance memory device of claim 10, wherein the second insulating pattern comprises silicon nitride, and wherein a thickness of the first insulating pattern is less than a thickness of the second insulating pattern.

15. The variable resistance memory device of claim 10, wherein each of the memory cells further comprises a lower electrode interposed between the variable resistance pattern and each of the first conductive lines, wherein the variable resistance pattern is interposed between the lower electrode and the switching pattern, wherein the first insulating pattern is disposed on a sidewall of the lower electrode, and wherein the second insulating pattern is interposed between the first insulating pattern and the sidewall of the lower electrode, and extends onto the sidewall of the variable resistance pattern.

16. The variable resistance memory device of claim 15, wherein the first insulating pattern extends onto the sidewall of the variable resistance pattern, and wherein the second insulating pattern is interposed between the first insulating pattern and the sidewall of the variable resistance pattern.

17. A variable resistance memory device comprising:

a plurality of memory cells disposed on a substrate, each of the memory cells comprising a variable resistance pattern disposed above or below a switching pattern, the memory cells include a first pair of the memory cells disposed on a pair of first conductive lines, respectively, and a second pair of the memory cells disposed on one of the pair of first conductive lines, the second pair of the memory cells connected to the one of the pair of first conductive lines via a single lower electrode;

a first insulating structure interposed between the first pair of the memory cells, and comprising:
a first insulating pattern interposed between the first pair of the memory cells; and
a second insulating pattern disposed on a sidewall of the variable resistance pattern of each of the first pair of the memory cells, wherein the second insulating pattern is interposed between the first insulating pattern and each of the first pair of the memory cells, the second insulating pattern extends between the first insulating pattern and the substrate, and the second insulating pattern comprises a material different from a material of the first insulating pattern; and a second insulating structure interposed between the second pair of the memory cells, and comprising:
a third insulating pattern interposed between the second pair of the memory cells; and
a fourth insulating pattern interposed between the third insulating pattern and each of the second pair of the memory cells, wherein the third insulating pattern comprises a material different from a material of the fourth insulating pattern, wherein a portion of the second insulating pattern extends between the first insulating pattern and the substrate, and extends on sidewalls of the first insulating pattern, wherein the portion of the second insulating pattern has a top surface recessed toward an inside of the top surface, and a bottom surface opposite to the recessed top surface, and wherein the first insulating pattern covers the recessed top surface of the second insulating pattern.

* * * * *